(12) United States Patent
Kumar et al.

(10) Patent No.: US 12,217,787 B2
(45) Date of Patent: Feb. 4, 2025

(54) APPARATUS, SYSTEM AND METHOD TO DETECT AND IMPROVE AN INPUT CLOCK PERFORMANCE OF A MEMORY DEVICE

(71) Applicant: Intel Corporation, Santa Clara, CA (US)

(72) Inventors: Arvind A. Kumar, Palo Alto, CA (US); James Alexander McCall, Portland, OR (US); Bill H. Nale, Livermore, CA (US); John R. Goles, Folsom, CA (US); Dean-Dexter R. Eugenio, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 721 days.

(21) Appl. No.: 17/349,854

(22) Filed: Jun. 16, 2021

(65) Prior Publication Data

US 2021/0312972 A1 Oct. 7, 2021

(51) Int. Cl.
| | |
|---|---|
| *G06F 1/12* | (2006.01) |
| *G06F 1/08* | (2006.01) |
| *G06F 13/16* | (2006.01) |
| *G11C 11/4072* | (2006.01) |
| *G11C 11/4074* | (2006.01) |
| *G11C 11/4076* | (2006.01) |
| *G11C 11/4093* | (2006.01) |

(52) U.S. Cl.
CPC ...... *G11C 11/4076* (2013.01); *G06F 13/1689* (2013.01); *G11C 11/4072* (2013.01); *G11C 11/4074* (2013.01); *G11C 11/4093* (2013.01)

(58) Field of Classification Search
None
See application file for complete search history.

(56) References Cited

U.S. PATENT DOCUMENTS

| | | | |
|---|---|---|---|
| 4,626,798 A  * | 12/1986 | Fried .................... | H03K 3/0315 331/177 R |
| 10,861,517 B1 * | 12/2020 | Maccarrone ......... | G11C 29/028 |

(Continued)

OTHER PUBLICATIONS

Alan Sguigna, "Memory Training, Testing, and Margining", Nov. 2, 2014, Asset (Year: 2014).*

*Primary Examiner* — Hyun Nam
(74) *Attorney, Agent, or Firm* — Alliance IP, LLC

(57) ABSTRACT

A method, apparatus and system. The method includes: performing one or more training iterations to tune a target clock signal frequency to be applied at a memory device, each of the one or more training iterations including: causing a modified clock signal frequency to be applied at the memory device; and decoding a quality feedback message from the memory device including an indication of a performance of the clock signal frequency at the memory device; and in response to a determination that the performance of the clock signal frequency falls within a target performance range of the memory device and that the clock signal frequency is below the target clock signal frequency, performing a subsequent training iteration of the one or more training iterations, and otherwise causing application at the memory device, during a memory operation, of a highest clock signal frequency corresponding to a training iteration for which performance of the clock signal was within the target performance range.

25 Claims, 9 Drawing Sheets

(56) References Cited

U.S. PATENT DOCUMENTS

| | | | | |
|---|---|---|---|---|
| 11,645,441 | B1* | 5/2023 | Jiang | G06F 30/398 |
| | | | | 716/108 |
| 12,107,509 | B1* | 10/2024 | Mohammed | G06N 3/045 |
| 2006/0066368 | A1* | 3/2006 | Gabato | H03K 5/1504 |
| | | | | 327/158 |
| 2011/0243289 | A1* | 10/2011 | Seol | G11C 7/222 |
| | | | | 375/371 |
| 2021/0312972 | A1* | 10/2021 | Kumar | G11C 11/4076 |
| 2022/0077862 | A1* | 3/2022 | Hong | G06F 3/0659 |
| 2024/0321338 | A1* | 9/2024 | Han | H03K 5/1565 |
| 2024/0330774 | A1* | 10/2024 | Huang | G06N 20/00 |

* cited by examiner

APPARATUS, SYSTEM AND METHOD TO DETECT AND IMPROVE AN INPUT CLOCK PERFORMANCE OF A MEMORY DEVICE

FIELD

Descriptions are generally related to computer memory systems, and more particular descriptions are related to on-die termination in memory subsystems, such as memory subsystems including dynamic random access memory (DRAM) devices in dual inline memory modules (DIMMs).

BACKGROUND

As DDR memory speeds increase there is risk the clock (CK) settings during power up will not be adequate for the base clock at normal (i.e. the desired) high frequency operation. This then requires a lower frequency boot up mode for basic settings. However, increasing the clock signal frequency rapidly to the desired high frequency can include risk for some memory device topologies, such as some Double Data Rate (DDR) topologies, including for example DDR5 topologies or next generation DDR topologies. In particular, where on-die termination (ODT) settings per load may vary dramatically across memory devices, across frequencies, and across raw-cards.

Having to go low to high frequency is not efficient in certain memory subsystems, including in registered (R) dual inline memory module (DIMM) (or RDIMM) systems where multiple ranks/channels and long frequency change times exist due to the phase locked loop (PLL) in the registered clock driver (RCD).

Some existing solutions set a default ODT setting per raw card. For example, DDR5 provides a single ODT setting per raw card including an on setting and an off setting. Some approaches add multiple default ODT settings per raw card.

Mechanisms are needed to mitigate risk associated with on-die termination in memory subsystems operating at increased clock frequencies.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, a memory subsystem provides a memory device (such as a DRAM) that includes an added mode to report back to the host information regarding a verification of the clock signal (CK) quality.

The prior art's solution of having a single setting for all frequencies across all raw card designs is not sufficient. The proposed approach according to embodiments provides a reliable and efficient mechanism to apply an effective termination and effective driver settings for a memory subsystem.

According to some embodiments, circuitry inside a memory device, such as inside a DRAM, is to cause a voltage response signal to be sent to a memory controller through data lines, the voltage response signal based on an analysis of the voltage response of the memory device to a clock signal input to the memory device. According to some embodiments, the memory device may perform the analysis. According to some embodiments, the clock signal input may be caused by the memory controller. The memory controller may compare the voltage response signal or encoded data sent by DRAM to a metric that is from a serial presence detect SPD to determine if the clock performance at the DRAM is acceptable (that is, if the performance of the DRAM is within a target performance range, for example as indicated by a manufacturer of the DRAM). The memory controller can make improvements to the clock signal based on the feedback message from DRAM. The target performance range may, as noted, be from a SPD.

Serial presence detect (SPD) is information stored on an electrically erasable programmable read-only memory (EEPROM) chip when a computer is booted. It may be located on the memory module, such as a DIMM, and may communicate to the BIOS of the memory controller the module size, data width, speed and voltage, which may be used to configure the module memory controller for maximum reliability and performance.

Figure 1A:
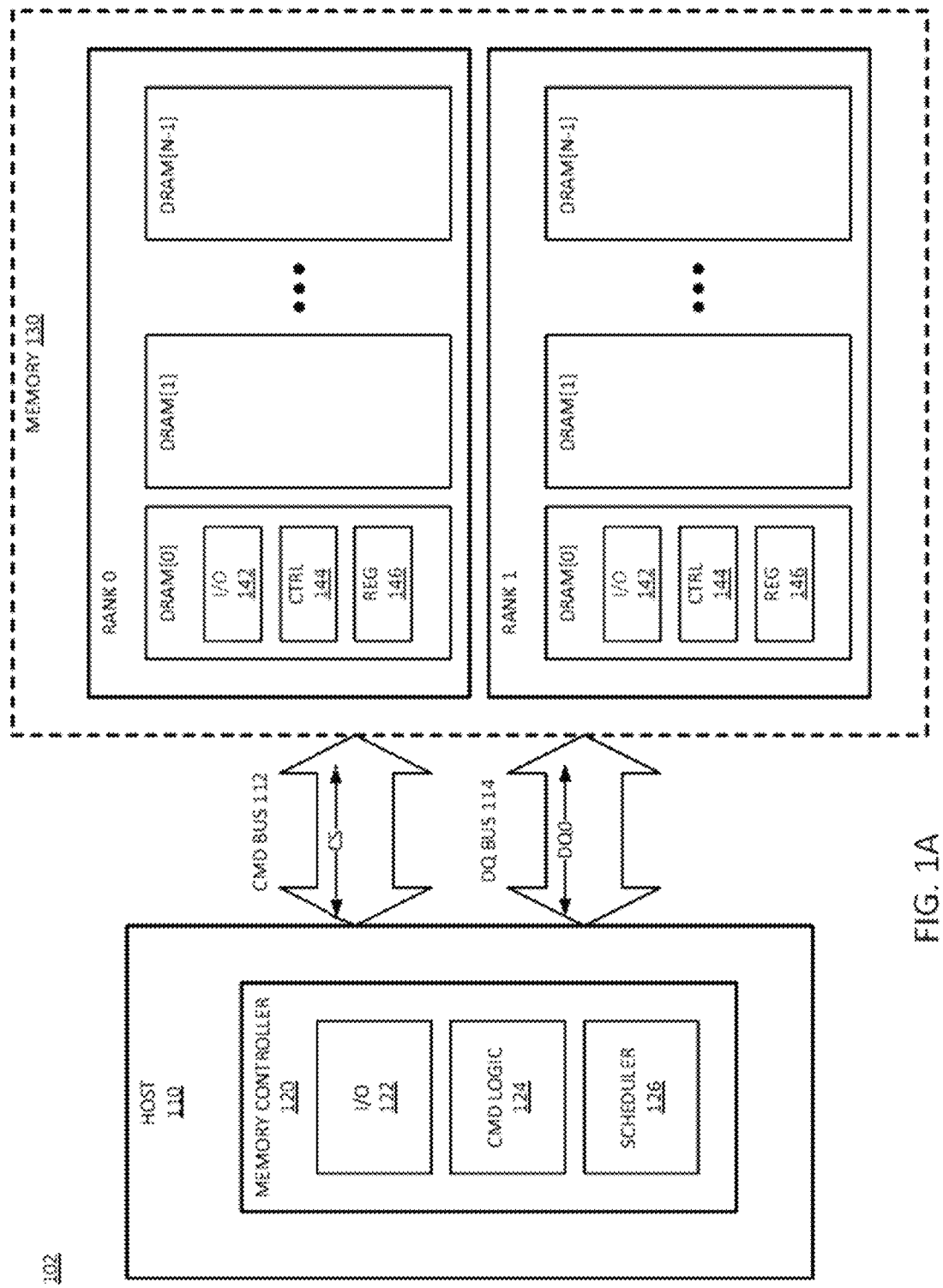
FIG. 1A is a block diagram of an example of a memory subsystem in which mechanisms according to embodiments may be implemented.

FIG. 1A is a block diagram of an example of a memory subsystem in which mechanisms according to embodiments may be implemented. System 100 represents elements of a computing system. System 100 can be considered to have a memory subsystem with memory controller 120 and memory system 130. Host 110 represents the hardware platform that controls the memory subsystem. Host 110 includes one or more processors (e.g., a central processing unit (CPU) or a graphics processing unit (GPU) that generate requests for data stored in memory system 130.

Host 110 includes memory controller 120, which can be integrated onto a processor device. Memory controller 120 includes I/O (input/output) 122 to connect to memory system 130. I/O includes connectors, signal lines, drivers, and other hardware to interconnect the memory devices to host 110. I/O 122 can include command I/O as represented by command (CMD) bus 112, and data I/O as represented by DQ (data) bus 114. CMD bus 112 includes command signal lines. The command signal lines enable memory controller 120 to send commands to memory system 130. The command signal lines include a CS (chip select) signal line. While illustrated as a chip select line, in one example, the chip select can be another type of device select. DQ bus 114 includes multiple data signal lines, including a DQ[0] or DQO signal line. For an N-bit interface, DQ bus 114 will include DQ[0:N−1]. DQO can be considered the first or least significant bit (LSB) of the data bus, and will thus be present in all DQ interfaces.

Memory controller 120 includes command (CMD) logic 124 to generate commands for memory. The commands can be commands for data access (such as Read, Write, Refresh, or other commands), or commands for configuration (such as mode register commands). Memory controller 120 includes scheduler 126 to schedule when to send commands in a sequence of operations. Scheduler 126 can control the timing for I/O in accordance with known timing to improve the chance that I/O will be error free. The timing is set through training.

Memory system 130 can include individual memory devices, or can represent a memory module. System 100 illustrates two ranks of memory devices in memory system 130. A rank refers to a collection of memory devices that share a select line. Thus, memory devices in a rank will execute operations in parallel. Rank[0] and Rank[1] are illustrated to include N DRAM (dynamic random access memory) devices or DRAMs. Typically a system with multiple ranks will have the same number of DRAMs in each of the ranks.

DRAM[0] of Rank[0] and DRAM[0] of Rank[1] are shown to include I/O 142, control (CTRL) 144, and register (REG) 146. Such components will be understood to be included in the other DRAMs as well. I/O 142 represents connection hardware comparable to I/O 122 of memory controller 120. I/O 142 enables connection of DRAMs to memory controller 120. Control logic 144 represents control components within the DRAM to decode and execute the commands and access operations. Control 144 causes the DRAM to perform the operations needed to execute the access initiated by memory controller 120. Register 146 represents one or more registers within the DRAM. Register 146 can include one or more configuration registers such as mode registers. Register 146 can store configuration information and information that determines a mode of operation by the DRAM in response to signals on command and data signal lines.

It will be understood that DQ bus 114 is typically multiple device interfaces in parallel, where DRAM[0] may be assigned DQ signal lines DQ[3:0], and DRAM[1] is assigned DQ [7:4], and so forth. DQO for DRAM[0] is DQO for DQ bus 114, and DQO for DRAM[1] is DQ4 for DQ bus 114. Different signal lines will be used in different configurations such as swizzling the signal line assignments, or using devices with different interfaces (e.g., using x8 devices instead of x4 devices), or other differences in implementation.

Figure 1B:
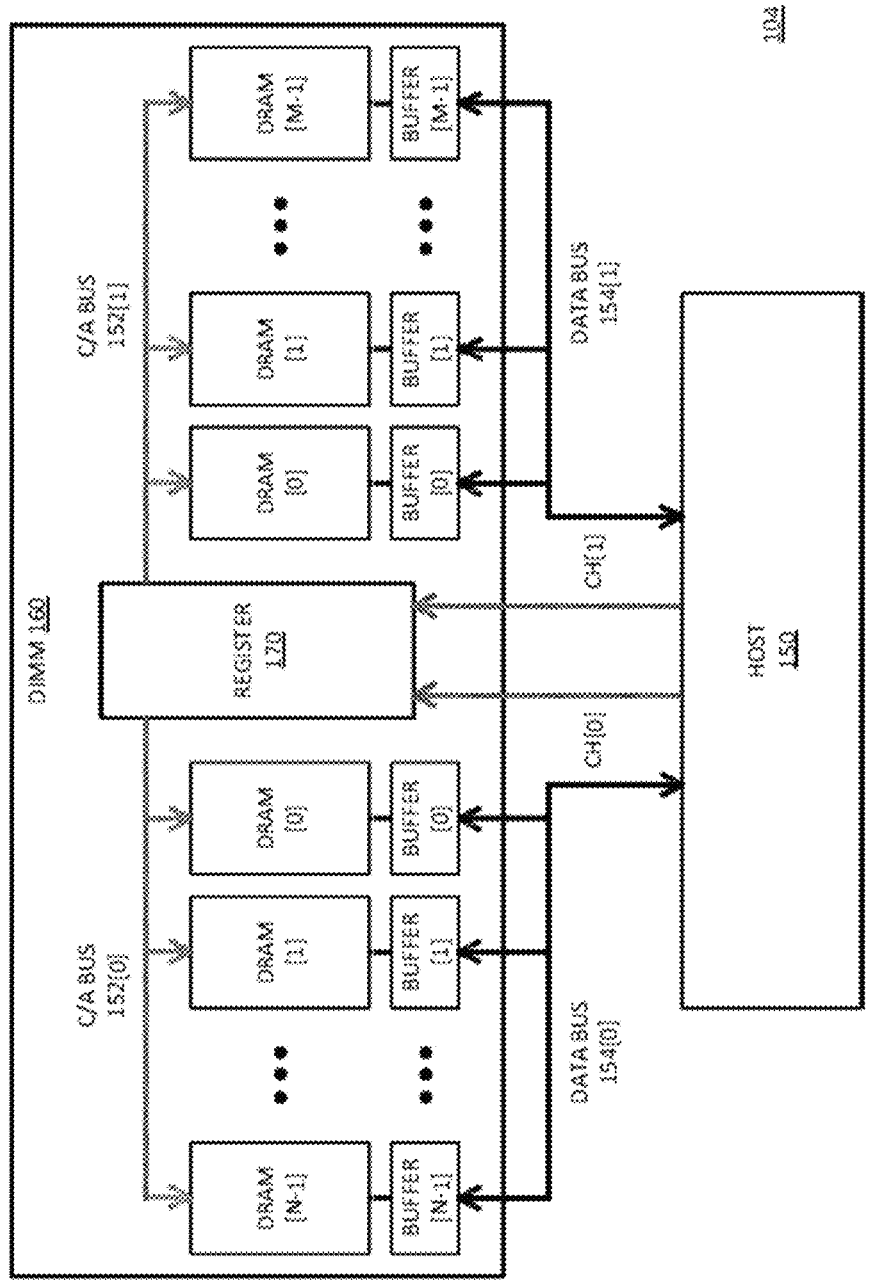
FIG. 1B is a block diagram of an example of a DIMM in which mechanisms according to embodiments may be implemented.

FIG. 1B is a block diagram of an example of a DIMM in which mechanisms according to embodiments may be implemented for memory devices. System 104 provides one example of a DIMM system in accordance with memory system 130 of system 102 of FIG. 1A. DIMM 160 is a memory module that includes multiple memory devices. System 104 can alternatively be implemented as a multi-device or multichip memory package, such as with stacked DRAMs and control logic that operates as register 170.

System 104 includes DIMM 160 with two channels of DRAM devices. Channel 0 (CH[0]) includes N DRAM devices, DRAM[0:N−1], and Channel 1 (CH[1]) includes M DRAM device, DRAM[0:M−1]. In one example, N=M. Depending on the system configuration, the DRAMs can have x4 data bus interfaces, x8 data bus interfaces, x16 data bus interfaces, or some other interface. Since the data interfaces between the DRAMs and host 150 are buffered, DIMM 160 can be considered to have N buffers for CH[0], and M buffers for CH[1], to match the respective number of DRAMs. In one example, the number of physical buffer devices is fewer than the number of DRAM devices, and one buffer chip will buffer the data signal lines for more than one DRAM device.

System 104 includes bidirectional data buses 154, with data bus 154[0] for CH[0], and data bus 154[1] for CH[1]. Data buses 154 provide for the exchange of data between the DRAMs and host 150. To access the data and to manage the DRAMs, system 104 includes unidirectional C/A or CMD buses 152, with C/A bus 152[0] for CH[0], and C/A bus 152[1] for CH[1]. Buses 152 can be considered unilateral multi-drop buses. Typically the configuration is in a fly-by topology. Host 150 provides a command to either CH[0] or CH[1] over a desired C/A bus, which goes through register 170 on DIMM 160. Register 170 forwards the commands to the DRAMs over C/A buses 152.

Register 170 represents a controller for system 104, or a controller for the memory module or DIMM 160. It will be understood that the controller represented by register 170 is different from a host controller or memory controller (not specifically shown) of host 150 or of a computing device in which system 104 is incorporated. Likewise, the controller of register 170 is different from an on-chip or on-die controller that is included on the DRAM devices. In one example, register 170 is an RCD (registered clock driver, which can also be referred to as a registering clock driver). The RCD receives information from host 150. Host 150 can be or include a memory controller. Register 170 buffers the signals from host 150 to the various DRAMs, and controls the timing and signaling to the DRAMs. In one example, register 170 is a controller on DIMM 160 to control signaling to the various memory devices. Register 170 may further amplify signals before it sends them to the various DRAMs.

While not specifically shown, host 150 includes I/O or interface hardware to couple to the components of DIMM 160, including the DRAMs, and the buffers if there are buffers. Additionally, register 170 and the DRAMs include I/O or interface hardware to couple to respective C/A buses. The DRAMs include hardware interfaces to couple to the data buses in addition to the command buses. In one example, the DRAMs couple to the data buses through the buffers. The buffers include I/O or interface hardware to couple to the DRAMs and to the data buses.

Figure 2:
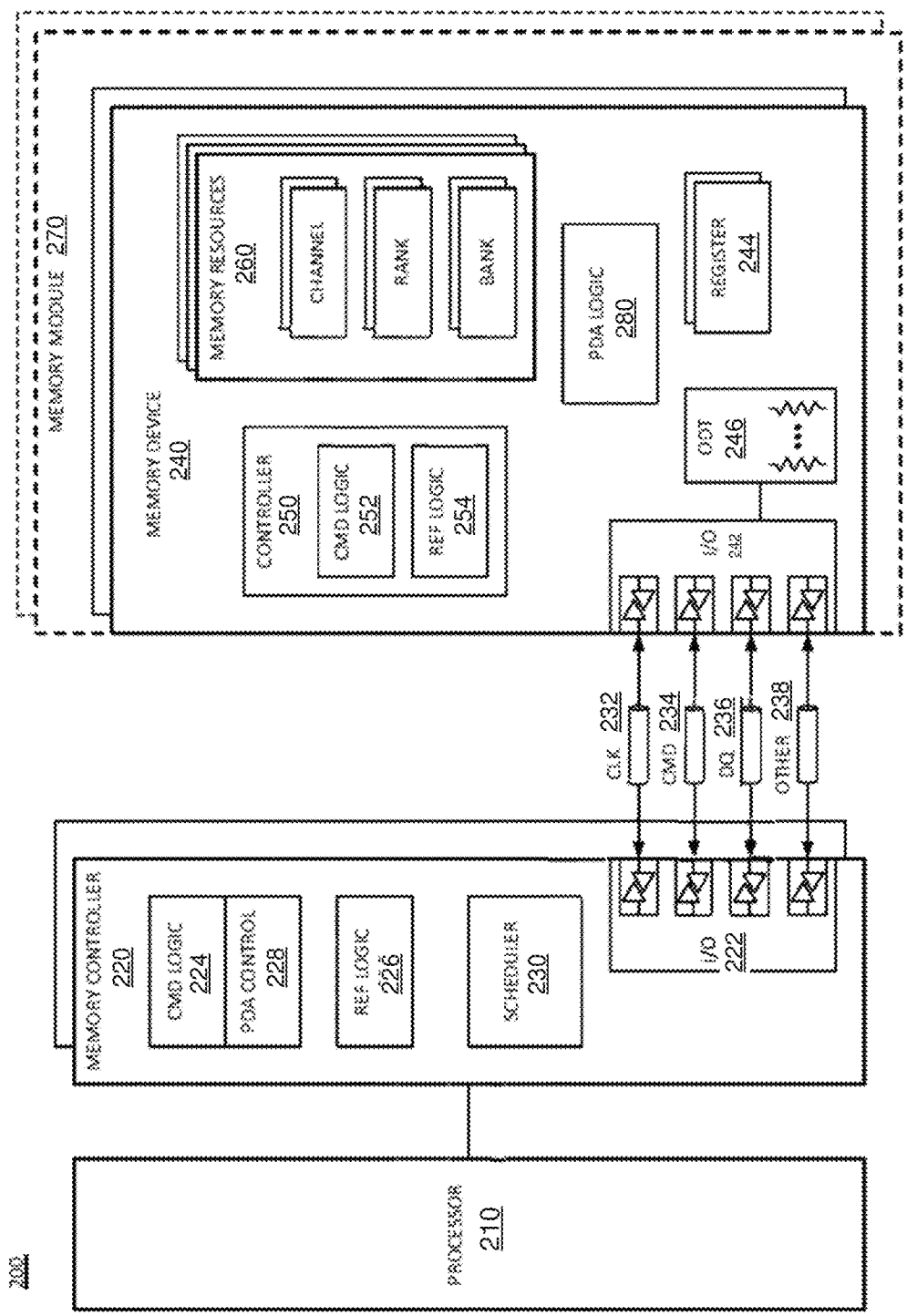
FIG. 2 is a block diagram of an example of a memory subsystem in which mechanisms according to embodiments may be implemented.

FIG. 2 is a block diagram of an example of a memory subsystem in which mechanisms according to embodiments may be implemented. System 200 includes a processor and elements of a memory subsystem in a computing device. System 200 can be in accordance with an example of system 102 or 104 of FIG. 1A or 1B, respectively.

In one example, memory module 270 represents a DIMM, and includes a register (e.g., an RDIMM or registered DIMM). In one example, memory module 270 includes multiple buffers that are separately addressable. In an RDIMM, the register buffers the C/A bus, but the data lines can be buffered.

Processor 210 represents a processing unit of a computing platform that may execute an operating system (OS) and applications, which can collectively be referred to as the host or the user of the memory. The OS and applications execute operations that result in memory accesses. Processor 210 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 200 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR5 (DDR version 5, JESD79-5, initial specification published in July 2020 by JEDEC), DDR4 (DDR version 4, JESD79, initial specification published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (currently in discussion by JEDEC), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one example, a system with volatile memory that needs to be refreshed can also include nonvolatile memory.

Memory controller 220 represents one or more memory controller circuits or devices for system 200. Memory controller 220 represents control logic that generates memory access commands in response to the execution of operations by processor 210. Memory controller 220 accesses one or more memory devices 240. Memory devices 240 can be DRAM devices in accordance with any referred to above. In one example, memory devices 240 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 220 manages a separate memory channel, although system 200 can be configured to have multiple channels managed by a single controller, or to have multiple controllers on a single channel. In one example, memory controller 220 is part of host processor 210, such as logic implemented on the same die or implemented in the same package space as the processor.

Memory controller 220 includes I/O interface logic 222 to couple to a memory bus, such as a memory channel as referred to above. I/O interface logic 222 (as well as I/O interface logic 242 of memory device 240) can include pins, pads, connectors, signal lines, traces, or wires, or other hardware to connect the devices, or a combination of these. I/O interface logic 222 can include a hardware interface. As illustrated, I/O interface logic 222 includes at least drivers/transceivers for signal lines. Commonly, wires within an integrated circuit interface couple with a pad, pin, or connector to interface signal lines or traces or other wires between devices. I/O interface logic 222 can include drivers, receivers, transceivers, or termination, or other circuitry or combinations of circuitry to exchange signals on the signal lines between the devices. The exchange of signals includes at least one of transmit or receive. While shown as coupling I/O 222 from memory controller 220 to I/O 242 of memory device 240, it will be understood that in an implementation of system 200 where groups of memory devices 240 are accessed in parallel, multiple memory devices can include I/O interfaces to the same interface of memory controller 220. In an implementation of system 200 including one or more memory modules 270, I/O 242 can include interface hardware of the memory module in addition to interface hardware on the memory device itself. Other memory controllers 220 will include separate interfaces to other memory devices 240.

The bus between memory controller 220 and memory devices 240 can be implemented as multiple signal lines coupling memory controller 220 to memory devices 240. The bus may typically include at least clock (CLK) 232, command/address (CMD) 234, and write data (DQ) and read data (DQ) 236, and zero or more other signal lines 238. In one example, a bus or connection between memory controller 220 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 200 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 220 and memory devices 240. An example of a serial bus technology is 8B10B encoding and transmission of high-speed data with embedded clock over a single differential pair of signals in each direction. In one example, CMD 234 represents signal lines shared in parallel with multiple memory devices. In one example, multiple memory devices share encoding command signal lines of CMD 234, and each has a separate chip select (CS_n) signal line to select individual memory devices.

It will be understood that in the example of system 200, the bus between memory controller 220 and memory devices 240 includes a subsidiary command bus CMD 234 and a subsidiary bus to carry the write and read data, DQ 236. In one example, the data bus can include bidirectional lines for read data and for write/command data. In another example, the subsidiary bus DQ 236 can include unidirectional write signal lines for write and data from the host to memory, and can include unidirectional lines for read data from the memory to the host. In accordance with the chosen memory technology and system design, other signals 238 may accompany a bus or sub bus, such as strobe lines DQS. Based on design of system 200, or implementation if a design supports multiple implementations, the data bus can have more or less bandwidth per memory device 240. For example, the data bus can support memory devices that have either a x32 interface, a x16 interface, a x8 interface, or other interface. The convention "xW," where W is an integer that refers to an interface size or width of the interface of memory device 240, which represents a number of signal lines to exchange data with memory controller 220. The interface size of the memory devices is a controlling factor on how many memory devices can be used concurrently per channel in system 200 or coupled in parallel to the same signal lines. In one example, high bandwidth memory devices, wide interface devices, or stacked memory configurations, or combinations, can enable wider interfaces, such as a x128 interface, a x256 interface, a x512 interface, a x424 interface, or other data bus interface width.

In one example, memory devices 240 and memory controller 220 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 240 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 240 represent memory resources for system 200. In one example, each memory device 240 is a separate memory die. In one example, each memory device 240 can interface with multiple (e.g., 2) channels per device or die. Each memory device 240 includes I/O interface logic 242, which has a bandwidth determined by the implementation of the device (e.g., x16 or x8 or some other interface bandwidth). I/O interface logic 242 enables the memory devices to interface with memory controller 220. I/O interface logic 242 can include a hardware interface, and can be in accordance with I/O 222 of memory controller, but at the memory device end. In one example, multiple memory devices 240 are connected in parallel to the same command and data buses. In another example, multiple memory devices 240 are connected in parallel to the same command bus, and are connected to different data buses. For example, system 200 can be configured with multiple memory devices 240 coupled in parallel, with each memory device responding to a command, and accessing memory resources 260 internal to each. For a Write operation, an individual memory device 240 can write a portion of the overall data word, and for a Read operation, an individual memory device 240 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one example, memory devices 240 are disposed directly on a motherboard or host system platform (e.g., a PCB (printed circuit board) on which processor 210 is disposed) of a computing device. In one example, memory devices 240 can be organized into memory modules 270. In one example, memory modules 270 represent dual inline memory modules (DIMMs). In one example, memory modules 270 represent other organization of multiple memory devices to share at least a portion of access or control circuitry, which can be a separate circuit, a separate device, or a separate board from the host system platform. Memory modules 270 can include multiple memory devices 240, and the memory modules can include support for multiple separate channels to the included memory devices disposed on them. In another example, memory devices 240 may be incorporated into the same package as memory controller 220, such as by techniques such as multi-chip-module (MCM), package-on-package, through-silicon via (TSV), or other techniques or combinations. Similarly, in one example, multiple memory devices 240 may be incorporated into memory modules 270, which themselves may be incorporated into the same package as memory controller 220. It will be appreciated that for these and other implementations, memory controller 220 may be part of host processor 210.

Memory devices 240 each include memory resources 260. Memory resources 260 represent individual arrays of memory locations or storage locations for data. Typically memory resources 260 are managed as rows of data, accessed via wordline (rows) and bitline (individual bits within a row) control. Memory resources 260 can be organized as separate channels, ranks, and banks of memory. Channels may refer to independent control paths to storage locations within memory devices 240. Ranks may refer to common locations across multiple memory devices (e.g., same row addresses within different devices). Banks may refer to arrays of memory locations within a memory device 240. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 240 include one or more registers 244. Register 244 represents one or more storage devices or storage locations that provide configuration or settings for the operation of the memory device. In one example, register 244 can provide a storage location for memory device 240 to store data for access by memory controller 220 as part of a control or management operation. In one example, register 244 includes one or more Mode Registers. In one example, register 244 includes one or more multipurpose registers. The configuration of locations within register 244 can configure memory device 240 to operate in different "modes," where command information can trigger different operations within memory device 240 based on the mode. Additionally or in the alternative, different modes can also trigger different operation from address information or other signal lines depending on the mode. Settings of register 244 can indicate configuration for I/O settings (e.g., timing, termination or ODT (on-die termination) 246, driver configuration, or other I/O settings).

ODT shifts the termination resistors from the motherboard to the DRAM die itself. These resistors can better suppress signal reflections, providing much better a signal-to-noise ratio in DDR memory. This allows for much higher clock speeds at much lower voltages. For example, in certain embodiments, a VCC voltage may signify termination, and ground may signify no termination.

A signal propagating from the memory controller to the memory devices, without termination, can encounter an impedance discontinuity at the line leading to the memory devices on the memory module. The signal that propagates along the line to the memory device will be reflected back onto the signal line, thereby introducing unwanted noise into the signal. ODT may be implemented to mitigate impedance discontinuity, and the resulting noise and distortions within the clock signal line with several combinations of resistors on the DRAM silicon along with other circuit trees. DRAM circuit designers can use a combination of transistors which have different values of turn-on resistance. The resistors can be combined to create a proper equivalent impedance value to the outside of the chip, whereby the signal line is being controlled by the ODT operation signal. Where an on-die termination value control circuit exists the DRAM controller manages the on-die termination resistance through a programmable configuration register which resides in the DRAM.

In one example, memory device 240 includes ODT 246 as part of the interface hardware associated with I/O 242. ODT 246 can be configured as mentioned above, and provide settings for impedance to be applied to the interface to specified signal lines. In one example, ODT 246 is applied to DQ signal lines. In one example, ODT 246 is applied to command signal lines. In one example, ODT 246 is applied to address signal lines. In one example, ODT 246 can be applied to any combination of the preceding. The ODT settings can be changed based on whether a memory device is a selected target of an access operation or a non-target device. ODT 246 settings can affect the timing and reflections of signaling on the terminated lines. Careful control over ODT 246 can enable higher-speed operation with improved matching of applied impedance and loading. ODT 246 can be applied to specific signal lines of I/O interface 242, 222, and is not necessarily applied to all signal lines.

Memory device 240 includes controller 250, which represents control logic within the memory device to control internal operations within the memory device. For example, controller 250 decodes commands sent by memory controller 220 and generates internal operations to execute or satisfy the commands. Controller 250 can be referred to as an internal controller, and is separate from memory controller 220 of the host. Controller 250 can determine what mode is selected based on register 244, and configure the internal execution of operations for access to memory resources 260 or other operations based on the selected mode. Controller 250 generates control signals to control the routing of bits within memory device 240 to provide a proper interface for the selected mode and direct a command to the proper memory locations or addresses. Controller 250 includes command logic 252, which can decode command encoding received on command and address signal lines. Thus, command logic 252 can be or include a command decoder. With command logic 252, memory device can identify commands and generate internal operations to execute requested commands.

Referring again to memory controller 220, memory controller 220 includes command (CMD) logic 224, which represents logic or circuitry to generate commands to send to memory devices 240. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 240, memory controller 220 can issue commands via I/O 222 to cause memory device 240 to execute the commands. In one example, controller 250 of memory device 240 receives and decodes command and address information received via I/O 242 from memory controller 220. Based on the received command and address information, controller 250 can control the timing of operations of the logic and circuitry within memory device 240 to execute the commands. Controller 250 is responsible for compliance with standards or specifications within memory device 240, such as timing and signaling requirements. Memory controller 220 can implement compliance with standards or specifications by access scheduling and control.

Memory controller 220 includes scheduler 230, which represents logic or circuitry to generate and order transactions to send to memory device 240. From one perspective, the primary function of memory controller 220 could be said to schedule memory access and other transactions to memory device 240. Such scheduling can include generating the transactions themselves to implement the requests for data by processor 210 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 220 typically includes logic such as scheduler 230 to allow selection and ordering of transactions to improve performance of system 200. Thus, memory controller 220 can select which of the outstanding transactions should be sent to memory device 240 in which order, which is typically achieved with logic much more complex that a simple first-in first-out algorithm. Memory controller 220 manages the transmission of the transactions to memory device 240, and manages the timing associated with the transaction. In one example, transactions have deterministic timing, which can be managed by memory controller 220 and used in determining how to schedule the transactions with scheduler 230.

In one example, memory controller 220 includes refresh (REF) logic 226. Refresh logic 226 can be used for memory resources that are volatile and need to be refreshed to retain a deterministic state. In one example, refresh logic 226 indicates a location for refresh, and a type of refresh to perform. Refresh logic 226 can trigger self-refresh within memory device 240, or execute external refreshes which can be referred to as auto refresh commands) by sending refresh commands, or a combination. In one example, system 200 supports all bank refreshes as well as per bank refreshes. All bank refreshes cause the refreshing of banks within all memory devices 240 coupled in parallel. Per bank refreshes cause the refreshing of a specified bank within a specified memory device 240. In one example, controller 250 within memory device 240 includes refresh logic 254 to apply refresh within memory device 240. In one example, refresh logic 254 generates internal operations to perform refresh in accordance with an external refresh received from memory controller 220. Refresh logic 254 can determine if a refresh is directed to memory device 240, and what memory resources 260 to refresh in response to the command.

Figure 3:
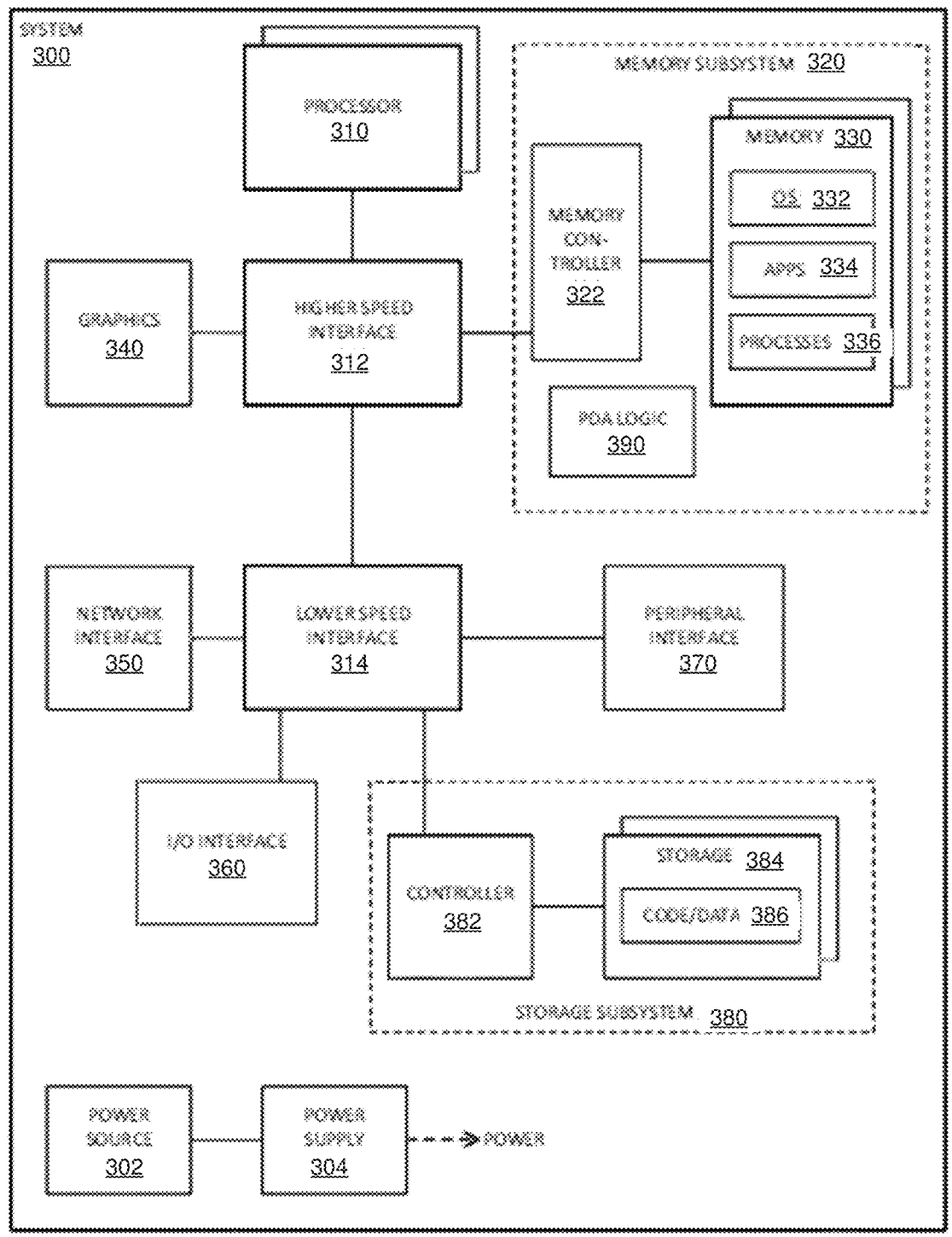
FIG. 3 is a block diagram of an example of a computing system in which a memory system with per device addressability can be implemented.

FIG. 3 is a block diagram of an example of a computing system according to some embodiments. System 300 represents a computing device in accordance with any example herein, and can be a laptop computer, a desktop computer, a tablet computer, a server, a gaming or entertainment control system, embedded computing device, or other electronic device.

In one example, system 300 includes PDA logic 390 in memory subsystem 320, which represents all hardware and other logic to implement PDA operation based on command encoding without the use of non-command signal lines, in accordance with any example provided. PDA logic 390 is implemented between memory controller 322 and memory 330.

System 300 includes processor 310 can include any type of microprocessor, central processing unit (CPU), graphics processing unit (GPU), processing core, or other processing hardware, or a combination, to provide processing or execution of instructions for system 300. Processor 310 controls the overall operation of system 300, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 300 includes interface 312 coupled to processor 310, which can represent a higher speed interface or a high throughput interface for system components that need higher bandwidth connections, such as memory subsystem 320 or graphics interface components 340. Interface 312 represents an interface circuit, which can be a standalone component or integrated onto a processor die. Interface 312 can be integrated as a circuit onto the processor die or integrated as a component on a system on a chip. Where present, graphics interface 340 interfaces to graphics components for providing a visual display to a user of system 300. Graphics interface 340 can be a standalone component or integrated onto the processor die or system on a chip. In one example, graphics interface 340 can drive a high definition (HD) display that provides an output to a user. In one example, the display can include a touchscreen display. In one example, graphics interface 340 generates a display based on data stored in memory 330 or based on operations executed by processor 310 or both.

Memory subsystem 320 represents the main memory of system 300, and provides storage for code to be executed by processor 310, or data values to be used in executing a routine. Memory subsystem 320 can include one or more memory devices 330 such as read-only memory (ROM), flash memory, one or more varieties of random access memory (RAM) such as DRAM, or other memory devices, or a combination of such devices. Memory 330 stores and hosts, among other things, operating system (OS) 332 to provide a software platform for execution of instructions in system 300. Additionally, applications 334 can execute on the software platform of OS 332 from memory 330. Applications 334 represent programs that have their own operational logic to perform execution of one or more functions. Processes 336 represent agents or routines that provide auxiliary functions to OS 332 or one or more applications 334 or a combination. OS 332, applications 334, and processes 336 provide software logic to provide functions for system 300. In one example, memory subsystem 320 includes memory controller 322, which is a memory controller to generate and issue commands to memory 330. It will be understood that memory controller 322 could be a physical part of processor 310 or a physical part of interface 312. For example, memory controller 322 can be an integrated memory controller, integrated onto a circuit with processor 310, such as integrated onto the processor die or a system on a chip.

While not specifically illustrated, it will be understood that system 300 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 300 includes interface 314, which can be coupled to interface 312. Interface 314 can be a lower speed interface than interface 312. In one example, interface 314 represents an interface circuit, which can include stand-alone components and integrated circuitry. In one example, multiple user interface components or peripheral components, or both, couple to interface 314. Network interface 350 provides system 300 the ability to communicate with remote devices (e.g., servers or other computing devices) over one or more networks. Network interface 350 can include an Ethernet adapter, wireless interconnection components, cellular network interconnection components, USB (universal serial bus), or other wired or wireless standards-based or proprietary interfaces. Network interface 350 can exchange data with a remote device, which can include sending data stored in memory or receiving data to be stored in memory.

In one example, system 300 includes one or more input/output (I/O) interface(s) 360. I/O interface 360 can include one or more interface components through which a user interacts with system 300 (e.g., audio, alphanumeric, tactile/touch, or other interfacing). Peripheral interface 370 can include any hardware interface not specifically mentioned above. Peripherals refer generally to devices that connect dependently to system 300. A dependent connection is one where system 300 provides the software platform or hardware platform or both on which operation executes, and with which a user interacts.

In one example, system 300 includes storage subsystem 380 to store data in a nonvolatile manner. In one example, in certain system implementations, at least certain components of storage 380 can overlap with components of memory subsystem 320. Storage subsystem 380 includes storage device(s) 384, which can be or include any conventional medium for storing large amounts of data in a nonvolatile manner, such as one or more magnetic, solid state, or optical based disks, or a combination. Storage 384 holds code or instructions and data 386 in a persistent state (i.e., the value is retained despite interruption of power to system 300). Storage 384 can be generically considered to be a "memory," although memory 330 is typically the executing or operating memory to provide instructions to processor 310. Whereas storage 384 is nonvolatile, memory 330 can include volatile memory (i.e., the value or state of the data is indeterminate if power is interrupted to system 300). In one example, storage subsystem 380 includes controller 382 to interface with storage 384. In one example controller 382 is a physical part of interface 314 or processor 310, or can include circuits or logic in both processor 310 and interface 314.

Power source 302 provides power to the components of system 300. More specifically, power source 302 typically interfaces to one or multiple power supplies 304 in system 302 to provide power to the components of system 300. In one example, power supply 304 includes an AC to DC (alternating current to direct current) adapter to plug into a wall outlet. Such AC power can be renewable energy (e.g., solar power) power source 302. In one example, power source 302 includes a DC power source, such as an external AC to DC converter. In one example, power source 302 or power supply 304 includes wireless charging hardware to charge via proximity to a charging field. In one example, power source 302 can include an internal battery or fuel cell source.

Figure 4:
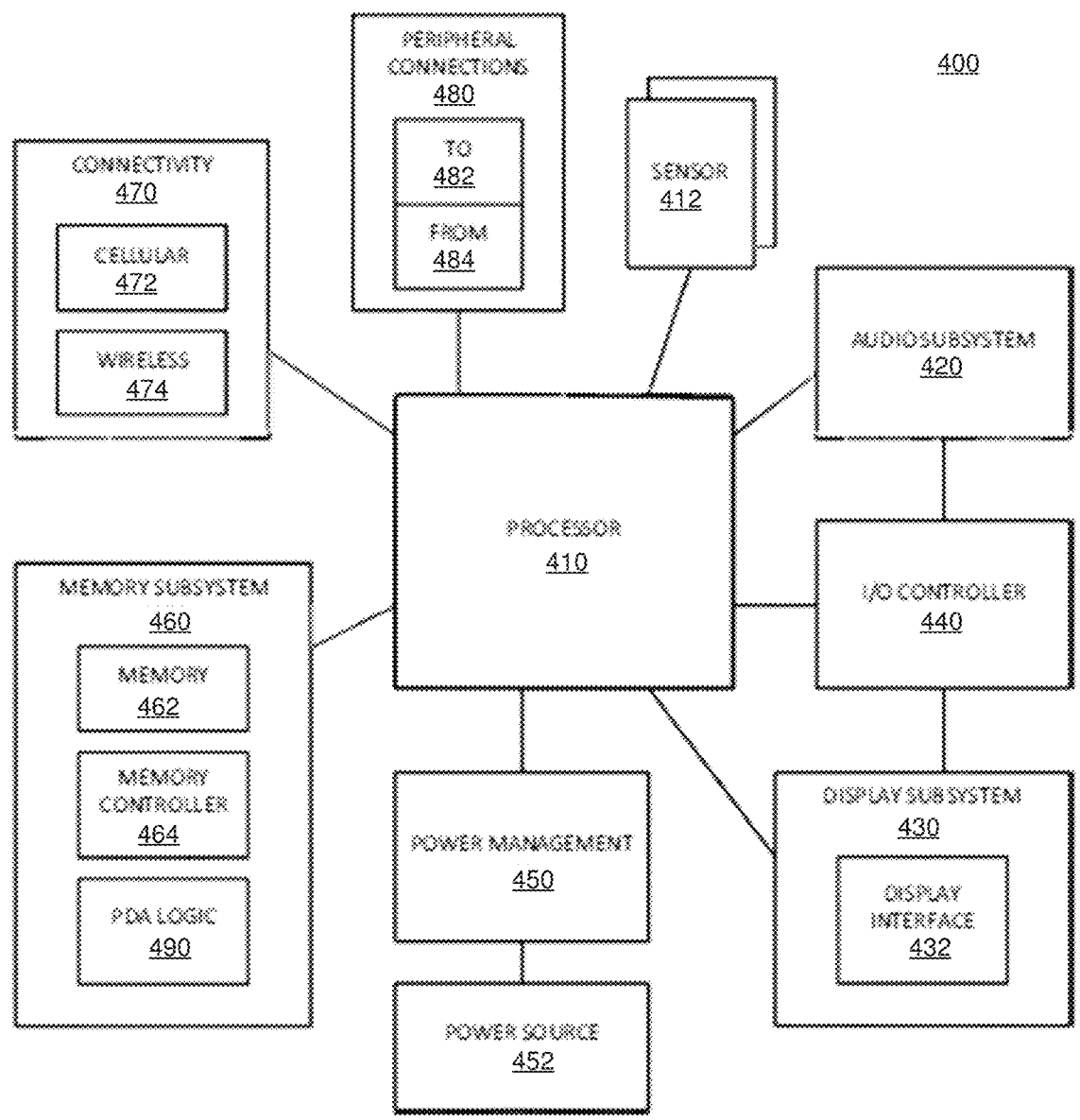
FIG. 4 is a block diagram of an example of a mobile device in which a memory system with per device addressability can be implemented.

FIG. 4 is a block diagram of an example of a mobile device in which a memory system with per device addressability can be implemented. Device 400 represents a mobile computing device, such as a computing tablet, a mobile phone or smartphone, wearable computing device, or other mobile device, or an embedded computing device. It will be understood that certain of the components are shown generally, and not all components of such a device are shown in device 400.

In one example, system 400 includes PDA logic 490 in memory subsystem 460, which represents all hardware and other logic to implement PDA operation based on command encoding without the use of non-command signal lines, in accordance with any example provided. PDA logic 490 is implemented between memory controller 464 and memory 462.

Device 400 includes processor 410, which performs the primary processing operations of device 400. Processor 410 can include one or more physical devices, such as microprocessors, application processors, microcontrollers, programmable logic devices, or other processing means. The processing operations performed by processor 410 include the execution of an operating platform or operating system on which applications and device functions are executed. The processing operations include operations related to I/O (input/output) with a human user or with other devices, operations related to power management, operations related to connecting device 400 to another device, or a combination. The processing operations can also include operations related to audio I/O, display I/O, or other interfacing, or a combination. Processor 410 can execute data stored in memory. Processor 410 can write or edit data stored in memory.

In one example, system 400 includes one or more sensors 412. Sensors 412 represent embedded sensors or interfaces to external sensors, or a combination. Sensors 412 enable system 400 to monitor or detect one or more conditions of an environment or a device in which system 400 is implemented. Sensors 412 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 412 can also include sensors for biometric systems such as fingerprint recognition systems, face detection or recognition systems, or other systems that detect or recognize user features. Sensors 412 should be understood broadly, and not limiting on the many different types of sensors that could be implemented with system 400. In one example, one or more sensors 412 couples to processor 410 via a frontend circuit integrated with processor 410. In one example, one or more sensors 412 couples to processor 410 via another component of system 400.

In one example, device 400 includes audio subsystem 420, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 400, or connected to device 400. In one example, a user interacts with device 400 by providing audio commands that are received and processed by processor 410.

Display subsystem 430 represents hardware (e.g., display devices) and software components (e.g., drivers) that provide a visual display for presentation to a user. In one example, the display includes tactile components or touchscreen elements for a user to interact with the computing device. Display subsystem 430 includes display interface 432, which includes the particular screen or hardware device used to provide a display to a user. In one example, display interface 432 includes logic separate from processor 410 (such as a graphics processor) to perform at least some processing related to the display. In one example, display subsystem 430 includes a touchscreen device that provides both output and input to a user. In one example, display subsystem 430 includes a high definition (HD) or ultra-high definition (UHD) display that provides an output to a user. In one example, display subsystem includes or drives a touchscreen display. In one example, display subsystem 430 generates display information based on data stored in memory or based on operations executed by processor 410 or both.

I/O controller 440 represents hardware devices and software components related to interaction with a user. I/O controller 440 can operate to manage hardware that is part of audio subsystem 420, or display subsystem 430, or both. Additionally, I/O controller 440 illustrates a connection point for additional devices that connect to device 400 through which a user might interact with the system. For example, devices that can be attached to device 400 might include microphone devices, speaker or stereo systems, video systems or other display device, keyboard or keypad devices, or other I/O devices for use with specific applications such as card readers or other devices.

As mentioned above, I/O controller 440 can interact with audio subsystem 420 or display subsystem 430 or both. For example, input through a microphone or other audio device can provide input or commands for one or more applications or functions of device 400. Additionally, audio output can be provided instead of or in addition to display output. In another example, if display subsystem includes a touchscreen, the display device also acts as an input device, which can be at least partially managed by I/O controller 440. There can also be additional buttons or switches on device 400 to provide I/O functions managed by I/O controller 440.

In one example, I/O controller 440 manages devices such as accelerometers, cameras, light sensors or other environmental sensors, gyroscopes, global positioning system (GPS), or other hardware that can be included in device 400, or sensors 412. The input can be part of direct user interaction, as well as providing environmental input to the system to influence its operations (such as filtering for noise, adjusting displays for brightness detection, applying a flash for a camera, or other features).

In one example, device 400 includes power management 450 that manages battery power usage, charging of the battery, and features related to power saving operation. Power management 450 manages power from power source 452, which provides power to the components of system 400. In one example, power source 452 includes an AC to DC (alternating current to direct current) adapter to plug into a wall outlet. Such AC power can be renewable energy (e.g., solar power, motion based power). In one example, power source 452 includes only DC power, which can be provided by a DC power source, such as an external AC to DC converter. In one example, power source 452 includes wireless charging hardware to charge via proximity to a charging field. In one example, power source 452 can include an internal battery or fuel cell source.

Memory subsystem 460 includes memory device(s) 462 for storing information in device 400. Memory subsystem 460 can include nonvolatile (state does not change if power to the memory device is interrupted) or volatile (state is indeterminate if power to the memory device is interrupted) memory devices, or a combination. Memory 460 can store application data, user data, music, photos, documents, or other data, as well as system data (whether long-term or temporary) related to the execution of the applications and functions of system 400. In one example, memory subsystem 460 includes memory controller 464 (which could also be considered part of the control of system 400, and could potentially be considered part of processor 410). Memory controller 464 includes a scheduler to generate and issue commands to control access to memory device 462.

Connectivity 470 includes hardware devices (e.g., wireless or wired connectors and communication hardware, or a combination of wired and wireless hardware) and software components (e.g., drivers, protocol stacks) to enable device 400 to communicate with external devices. The external device could be separate devices, such as other computing devices, wireless access points or base stations, as well as peripherals such as headsets, printers, or other devices. In one example, system 400 exchanges data with an external device for storage in memory or for display on a display device. The exchanged data can include data to be stored in memory, or data already stored in memory, to read, write, or edit data.

Connectivity 470 can include multiple different types of connectivity. To generalize, device 400 is illustrated with cellular connectivity 472 and wireless connectivity 474. Cellular connectivity 472 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 474 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 480 include hardware interfaces and connectors, as well as software components (e.g., drivers, protocol stacks) to make peripheral connections. It will be understood that device 400 could both be a peripheral device ("to" 482) to other computing devices, as well as have peripheral devices ("from" 484) connected to it. Device 400 commonly has a "docking" connector to connect to other computing devices for purposes such as managing (e.g., downloading, uploading, changing, synchronizing) content on device 400. Additionally, a docking connector can allow device 400 to connect to certain peripherals that allow device 400 to control content output, for example, to audiovisual or other systems.

In addition to a proprietary docking connector or other proprietary connection hardware, device 400 can make peripheral connections 480 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

Some mechanisms to achieve adaptive termination of memory devices, such as volatile memory devices, according to embodiments will be described in further detail below.

Although the description may refer to memory modules and DIMMs interchangeably, or may refer to memory devices and DRAMs interchangeably, it is to be understood that embodiments are not so limited, and include within their scope memory modules other than DIMMs, and memory devices other than DRAMs, including non-volatile memory devices.

Embodiments advantageously improve the reliability of the memory module at a given speed bin.

According to the state of the art, without actually connecting an external oscilloscope to each DRAM in order to assess the clock signal response of the same, there is no way to know the quality of a clock signal going from the memory controller, such as controller 220 of FIG. 2, into a DIMM, the quality being with respect to whether one or more DRAMs connected to a RCD of the DIMM are able to effectively detect the clock signal and implement memory operations based on the detected clock signal. Embodiments herein provide for a mechanism according to which the memory controller is to obtain feedback message from a memory device on the quality and/or performance of the clock signal. According to one embodiment, a quality and/or performance of the clock signal may include a measure of a maximum voltage detected at the memory device based on the clock signal. With this feedback message on quality and/or performance, the memory controller is to tune the terminations using ODT logic as described previously in the context of FIG. 2, and determine the fastest stable clock signal frequency to run the memory channel associated with the memory device.

Figure 5:
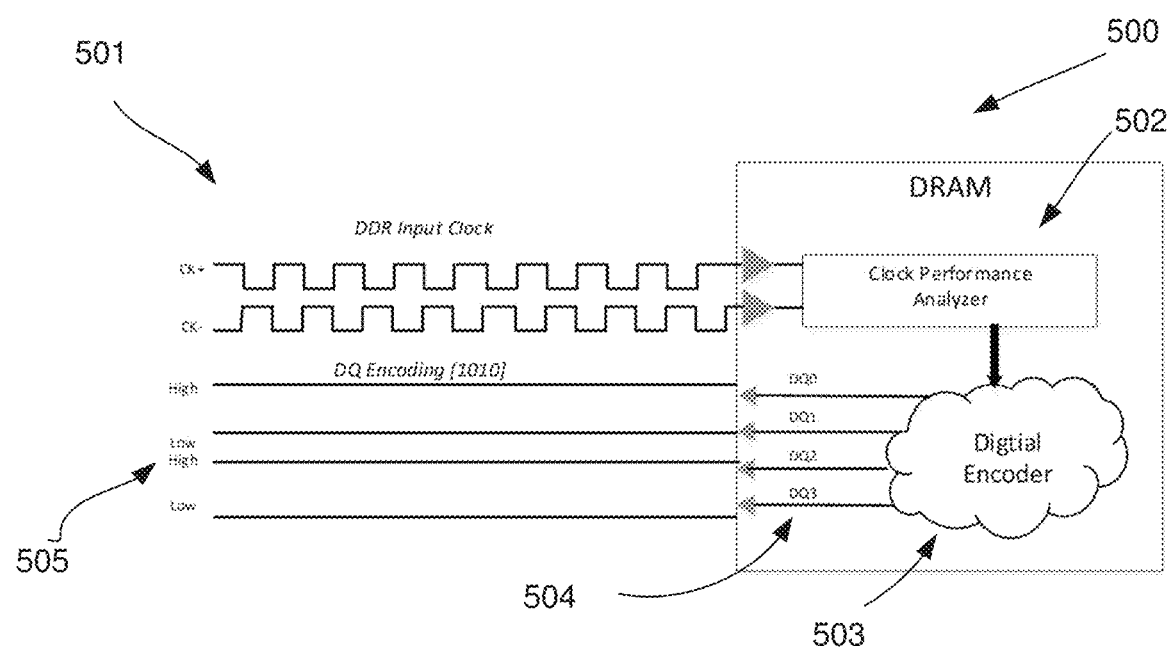
FIG. 5 is a block diagram of a DRAM being subjected to a DDR clock signal according to one embodiment.

Reference is now made to FIG. 5, which shows a DRAM 500, similar to any of the DRAMs of FIGS. 1B-4, being subjected to a DDR clock signal 501, for example a clock signal sent by a memory controller of a host computer through DQ data lines. According to some embodiments, the DRAM 500 may include circuitry that is to implement a clock performance analyzer logic 502 to analyze a quality of the clock signal 501 (e.g. a measure of the effectiveness of the clock signal 501 on DRAM 500, or, as noted above, a measure of whether the DRAM is able to detect the clock signal and implement memory operations based on the detected clock signal). A digital encoder 503 may digitally encode resulting data from implementation of the clock performance analyzer logic 502 to generate encoded data therefore, the encoded data corresponding to a quality feedback message to be sent to the memory controller. The encoded data may correspond to an encoded value from 0 to 15 if a 4-bit DQ data bus is used, as is the case shown in the embodiment of FIG. 5. Here DQ0-DQ3 of DRAM 500 may each transmit a value of 0 or 1 to the memory controller, with the combination of the values amounting to an encoded value for the encoded data that is a representation of quality and/or performance of DRAM 500 vis-à-vis the DDR clock signal 501. In the shown example the encoded value 505 is 1010, which value is caused to be sent to the memory controller.

Thus, according to some embodiments, the DRAM may include a clock signal performance analyzer logic, which may correspond to software and/or hardware, that is configured to analyze clock signal performance of the DRAM. The input clock performance of the DRAM may for example be based on clock signal specification parameters for the DRAM, which parameters may for example include pulse width and/or eye height for an eye pattern associated with the performance of the DRAM in the clock signal. In particular, for a DRAM minimum clock requirement specified in the JEDEC specification, examples of which include pulse width or height of the sinusoidal clock pattern, the amount of margin to these parameters can be adjusted according to some embodiments, which can lead to faster speeds on the memory, thus increasing system memory performance.

As noted above, after the DRAM has analyzed the clock signal, having determined its quality, it may then cause an encoded value (e.g. from 0-15) associated with the response to be transmitted via its DQ data lines back to the memory controller. The memory controller may then, according to one embodiment, compare the feedback, such as the encoded value, to metrics provided by the DRAM supplier in order to determine whether the response of the DRAM to the clock signal is compatible with the metrics.

The metrics may, for example, include a range of acceptable encoded values representing a voltage response to the DRAM as a result of applied clock signal. The metrics may, according to one embodiment, be stored in a serial presence detect (SPD) chip on the memory module, such as on the DIMM. The memory controller would get this feedback message at a first clock signal frequency (such as a lower frequency). If the metric is met, the memory controller may apply a second clock signal frequency higher than the first clock signal frequency to reprogram the ODT settings, such as through the RCD, and to sequentially increase clock signal frequencies, receive a corresponding feedback message (e.g. encoded value) from the DRAM, and compare the feedback message to the metrics in order to arrive at a target/maximum desired clock signal frequency for the DIMM.

According to one embodiment, if the clock signal frequency is to be tuned for a number of memory devices on a memory module, such as a number of DRAMs on a DIMM (see for example the DIMM of FIG. 1B and/or the plurality of memory resources 260 of FIG. 2), the memory controller may implement the above-described process to tune the clock signal frequency such that the feedback message from each of the memory devices on the memory module is compliant with metrics associated with said each of the memory devices as clock signal frequencies are increased. Once the high frequency metrics fail to be met for a highest applied clock signal frequency, the memory controller may store the associated ODT settings for an immediately previous clock signal frequency for which the metrics were met, and may then proceed with subsequent memory operations as would be recognize by one skilled in the art.

According to an alternative embodiments, comparison of the encoded value with the metrics for any given DRAM may be performed at the DRAM level, at the DIMM level, and/or at a dedicated circuitry distinct from either the memory controller, the host, any DRAM, or DIMM.

When clock input signals are at a low frequency (e.g. 400 and 1067 MHz of DDR3), clock speeds are relatively slow, and memory devices such as DRAMs on a DIMM may be left in a default state, and all DRAMs would be able to listen to the signal. Referring to FIG. 1B, according to the state of the art, the last DRAM of the number N or number M of DRAMs on a given DIMM per channel, that is, DRAM N−1 or DRAM M−1, are subject to termination, that is, they receive the clock input signal at a resistance that terminates the clock signal at the location of DRAM N−1 or DRAM M−1, typically holding the line to the last DRAM in a DIMM at a level 1 or level 0, as long as the other DRAMs on the DIMM within your channel are held at, respectively, level 0 or level 1. In typical DIMMs, the clock signal would needs to first go from the memory controller through the RCD, such as register 170 of FIG. 1B, which will drive the clock signal to each DRAM.

Although some embodiments are described herein in the context of a memory module that includes a register through which clock signals are routed to various memory devices of a memory module, such as register 170 of FIG. 1B routing and amplifying clock signals to DRAMs of DIMM, embodiments are not so limited, and include within their scope sending clock signals to memory devices without sending such signals through a register or RCD. The latter may apply for example where clock signals do not need amplification.

As desired or target clock signal frequencies or speeds increase with DDR5 and next generation DDR memory devices, for example up to 4800 MHz and beyond, there is an increased need for improved termination schemes in order to improve the quality/performance of the clock signal at memory devices of a memory module and to reduce noise and signal distortion. The prior art achieves termination by providing only two termination modes: a mode where termination is on, and a mode where termination does not apply.

Some embodiments provide for a memory controller to program more than one termination level for memory devices of a memory module. Such a mechanism is useful for higher clock frequencies, such as those in DDR5 and beyond, in order to ensure the benefits of termination to a clock signal, and to keep the signal cleaner from noise and distortion. For example, according to some embodiments, referring back to the example of FIG. 1B, DRAM N−1 may have a termination set at a first value, while DRAM 3 may have a termination set at a second value different from the first value.

According to some embodiments, a memory device is configured to communicate a feedback message to the memory controller regarding a quality of the clock signal applied thereto (quality feedback), and the memory controller is to use the quality feedback message to program a termination level for the memory device and to set a next clock signal frequency to be supplied to the memory device.

According to some embodiments, a memory controller may be configured to program a termination level of a memory device, for example by calibrating a termination impedance of the memory device in order to optimize the reduction of signal reflections therefrom during application of a clock signal to the memory device. The memory controller may program the termination level based on the frequency of the clock signal. The memory controller, at initialization of a memory device, through successive training iterations, may iteratively and successively program different terminations and successively apply different, such as successively larger, clock signal frequencies to the memory device. For each iteration of such training (training iteration, since a memory device to which clock signals are being applied is training the memory controller to set an acceptable clock signal frequency and termination for the memory device), the memory controller may decode the corresponding memory device quality feedback message regarding a quality of the clock signal, and, based on the same, move to a next clock signal frequency and a next termination impedance for the next training iteration. The memory controller may perform the training iterations until a highest possible clock signal frequency for the memory device and/or for the memory module (if multiple memory devices are involved) is determined, based on an acceptable quality feedback message for the highest possible clock signal frequency, the acceptable quality for example being achieved when a feedback message from a memory device (or where feedback message from more than one, such as from all memory devices of a memory module where a multi-device memory module is involved) indicates a quality for the given memory device that falls within a target performance range or target quality range of the memory device. The target performance range may be provided by a manufacturer of the memory device, and may for example be part of a SPD in an EEPROM of a DIMM that includes the memory device.

ODT calibration is a technique that involves calibrating the termination impedance in order to optimize the reduction of signal reflections. ODT calibration allows an optimal termination value to be established that compensates for variations in process and operating conditions. A calibrated ODT value significantly reduces unwanted signal reflections while only minimally attenuating the magnitude of the signal swing due to the added resistive loading. The resulting cleaner data signal allows for higher data rates.

ODT calibration may, according to one embodiment, be achieved by establishing an ODT impedance that is proportional to an external precision resistor. The same external resistor can also be used for output driver calibration. An ODT calibration controller may be part of the memory controller, and may compare the voltage drop across the ODT resistor network with a voltage drop across an external resistor represented. The ODT calibration controller may modify the resistor network with coarse tuning and fine tuning to achieve an impedance value that closely approximates the external, reference resistance.

Clock performance analyzer logic (which may involve software, hardware, or a combination thereof) may be implemented to evaluate the quality of the clock signal, and may for example correspond to any suitable circuit to determine a highest voltage detected at a memory device based on the clock signal being applied. The suitable circuit may, for example, include an envelope detector circuit. Decoding and evaluation of the feedback message signal from each memory device in a memory module may be performed at a memory controller according to some embodiments, for instance by making changes to the Basic Input Output System (BIOS) memory reference code (MRC) to provide this functionality.

Other embodiments include providing the above decoding and evaluation functionality in a dedicated circuitry either within the host, or external to the host, such as, for example, as part of a dedicated circuitry of the memory module.

Figure 6:
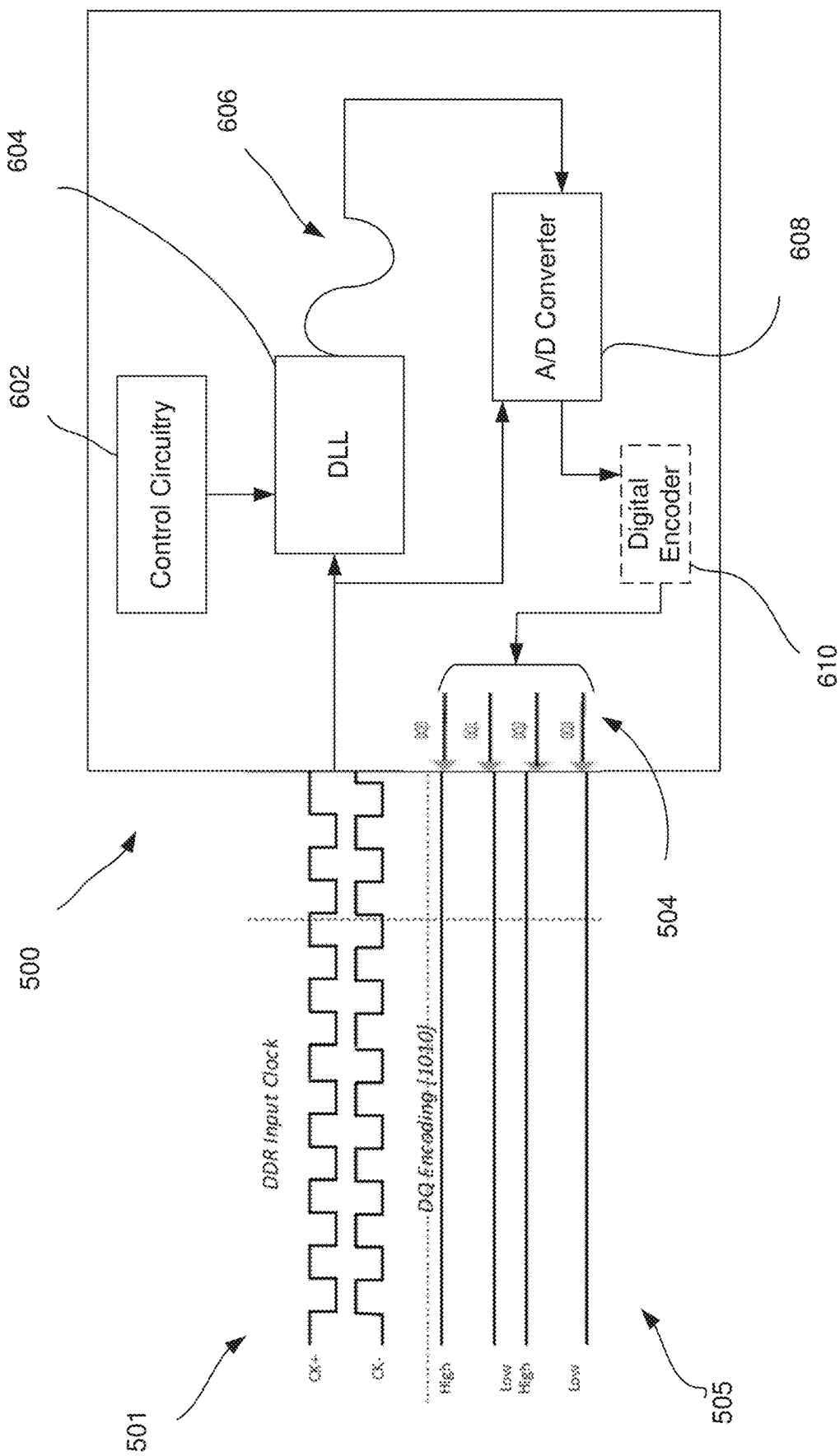
FIG. 6 is a block diagram of a DRAM similar to that of FIG. 5 according to an example embodiment.

Reference is now made to FIG. 6, which is a view similar to that of FIG. 5, but additionally showing a specific hardware implementation for a clock performance analyzer according to some embodiments. In FIG. 6, DRAM 500 receives clock signal 501, and generates a feedback message on quality based on the clock signal 501, the feedback message in the form of a 4-bit encoded data 505, similar to the embodiment of FIG. 5 described above. In the shown implementation of FIG. 6, the envelope detector circuitry may include a delay locked loop (DLL) 606 coupled to an analog to digital converter 608. The DLL may be 602 driven by DLL control circuitry 602 of the DRAM 500. DLL 606 may be controlled by DLL control circuitry 602 to use a delayed version of the clock signal to sample voltages corresponding to various points along a time-domain variation of the clock signal (thus performing self-sampling) within a given time window. The analog to digital converter 608 may convert the analog signals from the DLL self-sampling into digital signals, 606 and may either itself encode the same into encoded data to serve as quality feedback, or may input the same into an digital encoder 610 to encode the analog signals from the DLL self-sampling into quality feedback.

The encoded data may be sent to the memory controller by way of DQ lines DQ0-DQ3 of a data bus or DQ bus/line. In the shown embodiment of FIG. 6, the DQ lines correspond to 4 bits of data. When sending the feedback message signal on quality, the 4 bits become a proxy for the highest sampled voltage during the sampling operation by the DLL. In certain embodiments, for example, a 4-bit value of 1111 would represent a lowest voltage value, and a 4-bit value of 0000 would represent a highest voltage value detected at the DRAM by virtue of self-sampling of the DLL. DQ signals are typically to be held at a high value of 1 at each DQ line. If the clock signal frequency is too high, a DRAM may not be able to detect it or register it. If it cannot register the clock signal, the DQ line would remain at 1 instead of going low to 0.

In the context of an example of a 4-bit binary encoding of the quality feedback message as a proxy for maximum voltage sampled by a memory device, reference is now made to Table 1 below. Table 1 is an example of an instance where 1111 represents a lowest encoded value, 0000 represents a highest encoded value, and each unit increment in the encoded value corresponds to a voltage of 5 mV.

TABLE 1

| Encoded bits in DQ0:DQ3 | Encoded value | Corresponding Voltage if each unit increment is 5 mV |
| --- | --- | --- |
| 1111 | 0 | 0 |
| 1110 | 1 | 5 mV |
| 1101 | 2 | 10 mV |
| 1100 | 3 | 15 mV |
| 1011 | 4 | 20 mV |
| 1010 | 5 | 25 mV |
| 1001 | 6 | 30 mV |
| 1000 | 7 | 35 mV |
| 0111 | 8 | 40 mV |
| 0110 | 9 | 45 mV |
| 0101 | 10 | 50 mV |
| 0100 | 11 | 55 mV |
| 0011 | 12 | 60 mV |
| 0010 | 13 | 65 mV |
| 0001 | 14 | 70 mV |
| 0000 | 15 | 75 mV |

For example, the memory controller may calibrate a first termination of a DRAM, apply a first clock signal at a first frequency, and decode a first quality feedback message signal for the first clock signal, the feedback message signal corresponding to an encoded value of 1111, which would mean, according to an embodiment, that the DRAM has not been able to detect the clock signal and is not picking up a voltage (voltage at 0 mV). The memory controller may, as a result, calibrate a second termination of the DRAM different from the first termination and apply a second clock signal at a second frequency lower than the first frequency. The second encoded value for the second quality feedback message signal (for the second clock signal frequency) may, in such a case, as one example, correspond to 1010, meaning that the DRAM has been able to detect the second clock signal (there is some change in the bit values of the DQ lines from the default 1111). According to the table values of Table 1, 1010 may correspond to a maximum sampled voltage of 25 mV at the DRAM. The memory controller may compare the second encoded value to a target performance range for the DRAM to determine whether the second clock signal and associated second termination are acceptable for the DRAM. If the target performance range for the DRAM is 50 mV or above, the memory controller may then determine that the second clock signal and associated second termination are not acceptable, and may, as a result, go through one or more subsequent training iterations of calibrating or setting the DRAM termination value, changing the clock signal frequency, obtaining quality feedback message from the DRAM, and determining whether the new quality feedback message is within the target performance range.

A clock signal may be acceptable for a given DRAM if the DRAM is able to effectively detect the clock signal and implement memory operations based on the detected clock signal. Effectiveness of detection and implementation may be specified as a metric by the DRAM manufacturer (such as a target performance range), such as part of SPD regarding the DRAM. The metric may include minimum acceptable voltage level at the memory device based on the clock signal. The memory controller may determine whether the second clock signal and associated second termination are acceptable based on a comparison of a maximum voltage detected at the DRAM based on the second clock signal (and based on the second termination) with the minimum acceptable voltage level of the DRAM. If the maximum voltage detected at the DRAM is equal to or above the minimum acceptable voltage level, the memory controller may determine that the second clock signal frequency and associated second termination are acceptable. In such a case, in order to reach a highest possible clock signal frequency for the DRAM, the memory controller may further change the termination level of the DRAM and move the clock signal frequency to a higher level one or more times, until the quality feedback message indicates that the DRAM can no longer detect the clock signal frequency. In such a case, the memory controller may store as the appropriate clock signal frequency and termination, for the DRAM, the highest clock signal frequency and associated termination level for which the quality feedback message showed an acceptable value. The memory controller may store related settings for subsequent memory operations by the given DRAM thus analyzed using this highest clock signal frequency and associated termination level.

Where multiple DRAMs exist on a DIMM, the memory controller may likewise, after finding an acceptable clock signal frequency and termination for the combination of the DRAMs on the DIMM, further change the termination level of one or more DRAMs of the DIMM, and move the clock signal frequency to a higher level one or more times, until the quality feedback message from at least one of the DRAMs indicates that the at least one of the DRAMs can no longer detect the clock signal frequency. In such a case, the memory controller may store as the appropriate clock signal frequency and termination, for the DIMM, the highest clock signal frequency and associated termination level for which the quality feedback message for each DRAM showed an acceptable value. The memory controller may store related settings for subsequent memory operations by the given DIMM thus analyzed using this highest clock signal frequency and associated termination level.

As suggested previously, the memory controller may go through a number of training iterations to arrive at the acceptable clock signal frequency and acceptable termination level for each DRAM, with each iteration including a change in frequency of the clock signal, a possible change in termination level for a DRAM, a decoding of quality feedback message from the DRAM, and a determination, based on the quality feedback, as to whether a subsequent training iteration is needed. If the determination concludes that the maximum voltage level at the DRAM is at or above a minimum acceptable voltage level, the training iterations may proceed to increase the clock signal frequency. If the determination concludes that the maximum voltage level at the DRAM is below a minimum acceptable voltage level. In such a case, the memory controller may store as the appropriate clock signal frequency and termination, for the DRAM, the highest clock signal frequency and associated termination level for which the quality feedback message for the DRAM showed an acceptable value. The memory controller may store related settings for subsequent memory operations by the given DRAM thus analyzed using this highest clock signal frequency and associated termination level.

In the example of the values set forth in Table 1, a second quality feedback message encoded value of 1010 would correspond to 25 mV for a DRAM where the minimum acceptable voltage level of the DRAM is 50 mV. In such a case, the memory controller may repeat the iterative process outlined above until the quality feedback message encoded value returned is 0101 or higher, by decreasing the clock signal frequency until the maximum acceptable clock signal frequency is determined by trial and error.

Typical impedance values to calibrate or set terminations at a given DRAM may include, by way of example only, 20 ohms, 30 ohms, 40 ohms, 50 ohms, 60 ohms, 100 ohms, 120 ohms, 400 ohms, and or any other number based on application needs.

Where multiple DRAMs are involved on a given DIMM, according to one embodiment, the memory controller is to obtain quality feedback message from each DRAM of the DIMM that indicates that the termination level of said each DRAM, along with the clock signal frequency being supplied, are at acceptable levels, before stopping the training iterations. In such an embodiment, even if a single DRAM of the DIMM provides a quality feedback message that suggests the single DRAM is not at or above its minimum acceptable voltage level, the memory controller would continue the training iterations until all DRAMs of the DIMM have returned a quality feedback message that suggests all DRAMs are at or above their respective minimum voltage levels, and that a maximum clock signal frequency corresponding to the same has been reached.

A goal of embodiments is to get a memory device to work at a highest clock frequency that it can handle, or that the collective memory devices of a memory module to which it belongs can handle. According to one embodiment, a clock signal frequency at an initialization stage of the memory subsystem (such as subsystem 200 of FIG. 2 for example), that is, at a stage of the memory subsystem before operation of the memory subsystem for read and write operations, may be set at a relatively low value. For example, if the intended clock signal frequency is 5 GHz, the memory controller may start the initialization stage of the training iterations at a starting clock signal frequency of 1 GHz. The reason for starting at low frequency clock is so that the DRAM detect the clock signal. A next training iteration may involve raising the clock signal frequency to 2 GHz, and so forth. Each training iteration may involve raising the clock signal, optionally changing the termination of each memory device, receiving feedback message from the memory devices, and determining whether the quality feedback message from the memory device is at an acceptable level. The training iterations are to stop once a maximum clock signal frequency is achieved by the memory controller for which the quality feedback message is acceptable. Thus, the memory controller may, through training iterations, successively loop to successively higher frequency bins until a maximum possible frequency bin is reached for the memory device or memory module being taken through the training iterations.

Figure 7:
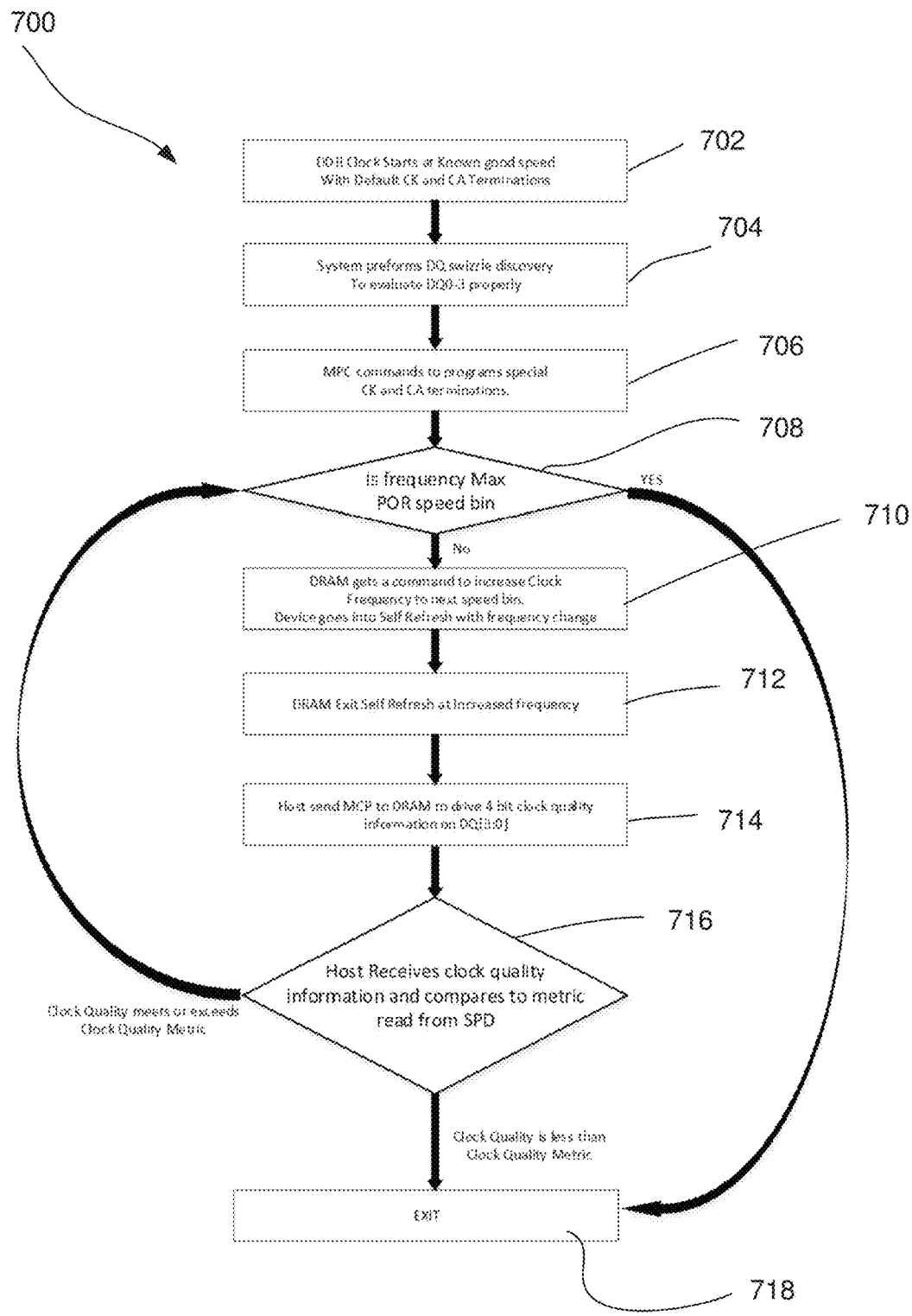
FIG. 7 is a flow diagram of a process according to an embodiment.

Reference is now made to the flow chart of FIG. 7 which shows a process 700 for performing termination training on a DRAM according to some embodiments.

In operation 702, the DDR clock starts at a known good speed, with default clock (CK) and command address (CA) terminations for the DRAMs on a MINIM.

At operation 704, the memory controller performs a DQ swizzle discovery on the DQ lines of a DRAM, for example where a 4-bit scheme is used, on DQ0:DQ3. DQ swizzle discovery allows the memory controller to determine the correct DQ addresses for any given DRAM, and ensures that correct DQ addresses are used especially where DQ lines to DRAMs may be routed differently (for example by a customer of the DIMM including the DRAMs) from their original routing scheme.

At operation 706, the memory controller sends a command to the DRAM to program a clock signal at a given frequency and to program a termination at a given level for the DRAM. The command may be by way of multipurpose command (MPC) signaling.

At operation 708, in response to a determination that the clock signal frequency is at or above a maximum of a plan of record (POR) (i.e. that the maximum desired clock signal frequency has been reached or surpassed), the memory controller may move to operation 718 to exit the termination training. Still at operation 708, in response to a determination that the clock signal frequency is below a maximum of a plan of record (POR) (i.e. that the maximum desired clock signal frequency has not been reached or surpassed), the memory controller may move to a training iteration starting at operation 710.

At operation 710, the memory controller may send a command to the DRAM including a clock signal with a frequency increased to a next level speed bin. As a result of the clock signal frequency increase command, the DRAM may go into a self-refresh operation. After the DRAM exits self-refresh at operation 712, the memory controller may, at operation 714, send a command to the DRAM to drive a clock quality information, or quality feedback message on its DQ lines, and where the quality feedback message is to be in the form of a 4-bit binary code, to send such feedback message on DQ0:DQ3.

At operation 716, in response to a determination that the quality feedback message from operation 714 meets or exceeds a minimum quality feedback message level for the DRAM (e.g. a minimum acceptable voltage level for the DRAM), the memory controller may go back through iterations starting at operation 708 until: (1) the maximum clock signal frequency is reached for quality feedback message that is acceptable, at which point it would move to operation 718 and exit the training operation (and store the settings corresponding to the last clock signal frequency and termination level—not shown); or (2) until the quality feedback message as compared with the minimum quality level (for example as determined through SPD information) does not meet an acceptable level as determined at operation 716. In the case of the latter, the memory controller may store the associated settings for an immediately previous clock signal frequency for which the quality feedback message was acceptable, and may then proceed with subsequent memory operations as would be recognize by one skilled in the art.

Figure 8:
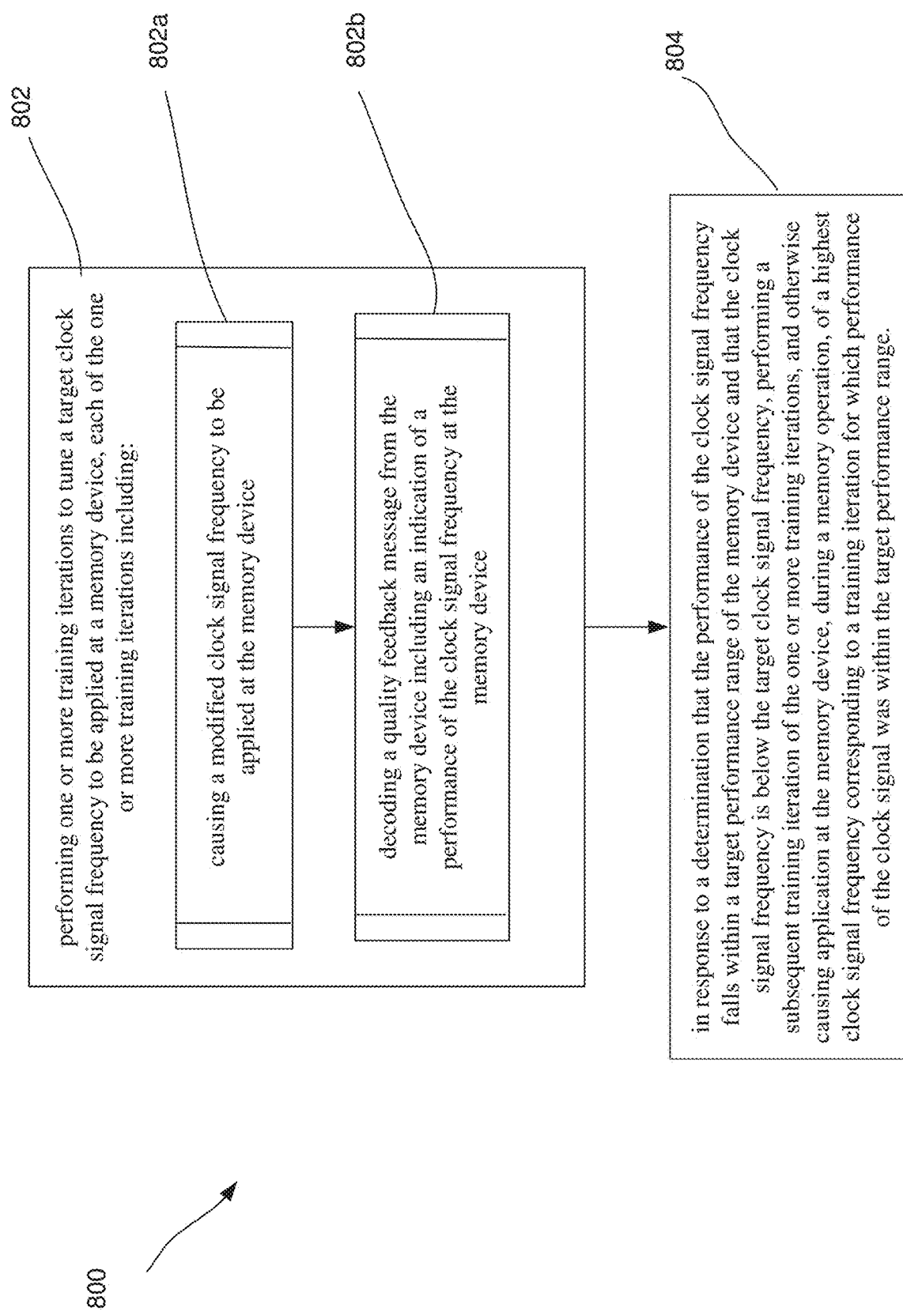
FIG. 8 is a flow diagram of a process according to another embodiment.

Referring now to FIG. 8, a process 800 according to some embodiments includes, at operation 802, performing one or more training iterations to tune a target clock signal frequency to be applied at a memory device, each of the one or more training iterations including: at sub-process 802a, causing a modified clock signal frequency to be applied at the memory device; and, at sub-process 802b, decoding a quality feedback message from the memory device including an indication of a performance of the clock signal frequency at the memory device. At operation 804, in response to a determination that the performance of the clock signal frequency falls within a target performance range of the memory device and that the clock signal frequency is below the target clock signal frequency, performing a subsequent training iteration of the one or more training iterations, and otherwise causing application at the memory device, during a memory operation, of a highest clock signal frequency corresponding to a training iteration for which performance of the clock signal was within the target performance range.

In one example, a memory subsystem may be part of a larger system that includes the host processor device coupled to the memory controller; a display communicatively coupled to a host processor; a network interface communicatively coupled to a host processor; or a battery to power the system.

The flow described in FIGS. 7 and 8 are merely representative of operations that may occur in particular embodiments. In other embodiments, additional operations may be performed by the components of the systems shown in FIGS. 1-6. Various embodiments of the present disclosure contemplate any suitable mechanisms for accomplishing the functions described herein. Some of the operations illustrated in FIGS. 7 and 8 may be repeated, combined, modified, or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein may refer to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the flows described or functionality of the various components described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Examples of some embodiments are PROVIDED below.

Example 1 includes an integrated circuit of a memory subsystem including: an input and output (I/O) interface to connect to a memory device; one or more processors coupled to the I/O interface and configured to: perform one or more training iterations to tune a target clock signal frequency to be applied at the memory device, each of the one or more training iterations including: causing a modified clock signal frequency to be applied at the memory device; and decoding a quality feedback message from the memory device including an indication of a performance of the clock signal frequency at the memory device; and in response to a determination that the performance of the clock signal frequency falls within a target performance range of the memory device and that the clock signal frequency is below the target clock signal frequency, perform a subsequent training iteration of the one or more training iterations, and otherwise cause application at the memory device, during a memory operation, of a highest clock signal frequency corresponding to a training iteration for which performance of the clock signal was within the target performance range.

Example 2 includes the subject matter of Example 1, wherein: the memory device is part of a memory module including a plurality of memory devices; the one or more processors are to perform the one or more training iterations to tune the target clock signal frequency to be applied at the memory devices; causing includes causing the modified clock signal frequency to be applied at the memory devices; and decoding a quality feedback message from the memory device includes decoding a respective quality feedback message from respective ones of the memory devices, each quality feedback message including an indication of a performance of the clock signal frequency at respective ones of the memory devices; and the one or more processors are further to, in response to a determination that the performance of the clock signal at said respective ones of the memory devices falls within a corresponding target performance range the respective ones of the memory devices, and that the clock signal frequency is below the target clock signal frequency, perform a subsequent training iteration of the one or more training iterations, and otherwise cause application at the memory devices, during memory operations, of a highest clock signal frequency corresponding to a training iteration for which performance of the clock signal was within target performance ranges of the memory devices.

Example 3 includes the subject matter of Example 2, wherein the memory module includes a dual inline memory module (DIMM), and the memory devices include respective dynamic random access memories (DRAMs).

Example 4 includes the subject matter of Example 3, wherein the DIMM includes a register coupled to the DRAMs, the one or more processors to cause the modified clock signal frequency to be applied by sending a command through the register to modify clock signal frequency at the DRAMs.

Example 5 includes the subject matter of Example 2, wherein each of the one or more training iterations further includes modifying a termination level of at least one of the memory devices based on the clock signal frequency and prior to decoding.

Example 6 includes the subject matter of Example 1, wherein the one or more training iterations include a plurality of training iterations, the one or more processors to: modify the clock signal frequency at each successive training iteration to a successively higher clock signal frequency until a determination that the performance of the clock signal does not fall within the target performance range; and in response to the determination that the performance of the clock signal does not fall within the target performance range, cause the application at the memory device, during the memory operation, of the highest clock signal frequency corresponding to the training iteration for which performance of the clock signal was within the target performance range.

Example 7 includes the subject matter of Example 1, wherein the quality feedback message includes encoded data corresponding to a maximum voltage detected at the memory device based on the clock signal frequency.

Example 8 includes the subject matter of Example 7, wherein the encoded data consists of n-bit binary data, the one or more processors to receive the n-bit binary data through n respective data (DQ) buses connected to the I/O interface.

Example 9 includes the subject matter of Example 7, wherein the target performance range of the memory device corresponds to a minimum acceptable voltage level at the memory device based on the clock signal frequency.

Example 10 includes the subject matter of Example 1, wherein the one or more processors are to determine the target performance range from serial presence detect (SPD) data corresponding to the memory device.

Example 11 includes the subject matter of Example 1, wherein the one or more processors are at least one of: to determine whether the performance of the clock signal frequency falls within the target performance range of the memory device or to receive, through the I/O interface, information based on a determination as to whether the performance of the clock signal frequency falls within the target performance range of the memory device.

Example 12 includes the subject matter of Example 1, wherein the I/O interface and the one or more processors are part of a memory controller, the integrated circuit further including a central processing unit connected to the memory controller through the I/O interface.

Example 13 includes the subject matter of Example 1, wherein the one or more processors are to tune the target clock signal frequency during initialization of the memory device.

Example 14 includes a method to be performed at an integrated circuit of a memory subsystem, the method including: performing one or more training iterations to tune a target clock signal frequency to be applied at a memory device, each of the one or more training iterations including: causing a modified clock signal frequency to be applied at the memory device; and decoding a quality feedback message from the memory device including an indication of a performance of the clock signal frequency at the memory device; and in response to a determination that the performance of the clock signal frequency falls within a target performance range of the memory device and that the clock signal frequency is below the target clock signal frequency, performing a subsequent training iteration of the one or more training iterations, and otherwise causing application at the memory device, during a memory operation, of a highest clock signal frequency corresponding to a training iteration for which performance of the clock signal was within the target performance range.

Example 15 includes the subject matter of Example 14, wherein: the memory device is part of a memory module including a plurality of memory devices; performing includes performing the one or more training iterations to tune the target clock signal frequency to be applied at the memory devices; causing includes causing the modified clock signal frequency to be applied at the memory devices; and decoding a quality feedback message from the memory device includes decoding a respective quality feedback message from respective ones of the memory devices, each quality feedback message including an indication of a performance of the clock signal frequency at respective ones of the memory devices; and the method further includes, in response to a determination that the performance of the clock signal at said respective ones of the memory devices falls within a corresponding target performance range the respective ones of the memory devices, and that the clock signal frequency is below the target clock signal frequency, performing a subsequent training iteration of the one or more training iterations, and otherwise causing application at the memory devices, during memory operations, of a highest clock signal frequency corresponding to a training iteration for which performance of the clock signal was within target performance ranges of the memory devices.

Example 16 includes the subject matter of Example 15, wherein the memory module includes a dual inline memory module (DIMM), and the memory devices include respective dynamic random access memories (DRAMs).

Example 17 includes the subject matter of Example 16, wherein the DIMM includes a register coupled to the DRAMs, the method including causing the modified clock signal frequency to be applied by sending a command through the register to modify clock signal frequency at the DRAMs.

Example 18 includes the subject matter of Example 15, wherein each of the one or more training iterations further includes modifying a termination level of at least one of the memory devices based on the clock signal frequency and prior to decoding.

Example 19 includes the subject matter of Example 14, wherein the one or more training iterations include a plurality of training iterations, the method including: modifying the clock signal frequency at each successive training iteration to a successively higher clock signal frequency until a determination that the performance of the clock signal does not fall within the target performance range; and in response to the determination that the performance of the clock signal does not fall within the target performance range, causing the application at the memory device, during the memory operation, of the highest clock signal frequency corresponding to the training iteration for which performance of the clock signal was within the target performance range.

Example 20 includes the subject matter of Example 14, wherein the quality feedback message includes encoded data corresponding to a maximum voltage detected at the memory device based on the clock signal frequency.

Example 21 includes the subject matter of Example 20, wherein the encoded data consists of n-bit binary data, the method including receiving the n-bit binary data through n respective data (DQ) buses connected to an I/O interface.

Example 22 includes the subject matter of Example 20, wherein the target performance range of the memory device corresponds to a minimum acceptable voltage level at the memory device based on the clock signal frequency.

Example 23 includes the subject matter of Example 14, further including determining the target performance range from serial presence detect (SPD) data corresponding to the memory device.

Example 24 includes the subject matter of Example 14, wherein the method includes at least one of: determining whether the performance of the clock signal frequency falls within the target performance range of the memory device or receiving, through an I/O interface, information based on a determination as to whether the performance of the clock signal frequency falls within the target performance range of the memory device.

Example 25 includes the subject matter of Example 14, wherein integrated circuit includes a memory controller of a host processor.

Example 26 includes the subject matter of Example 14, wherein performing the one or more training iterations to tune the target clock signal frequency includes performing the one or more training iterations to tune the target clock signal frequency during initialization of the memory device.

Example 27 includes a non-transitory machine-readable storage medium having instructions stored thereon, the instructions, when executed by an integrated circuit of a memory subsystem, to cause the integrated circuit to perform operations including: performing one or more training iterations to tune a target clock signal frequency to be applied at a memory device, each of the one or more training iterations including: causing a modified clock signal frequency to be applied at the memory device; and decoding a quality feedback message from the memory device including an indication of a performance of the clock signal frequency at the memory device; and in response to a determination that the performance of the clock signal frequency falls within a target performance range of the memory device and that the clock signal frequency is below the target clock signal frequency, performing a subsequent training iteration of the one or more training iterations, and otherwise causing application at the memory device, during a memory operation, of a highest clock signal frequency corresponding to a training iteration for which performance of the clock signal was within the target performance range.

Example 28 includes the subject matter of Example 27, wherein: the memory device is part of a memory module including a plurality of memory devices; performing includes performing the one or more training iterations to tune the target clock signal frequency to be applied at the memory devices; causing includes causing the modified clock signal frequency to be applied at the memory devices; and decoding a quality feedback message from the memory device includes decoding a respective quality feedback message from respective ones of the memory devices, each quality feedback message including an indication of a performance of the clock signal frequency at respective ones of the memory devices; and the operations further include, in response to a determination that the performance of the clock signal at said respective ones of the memory devices falls within a corresponding target performance range the respective ones of the memory devices, and that the clock signal frequency is below the target clock signal frequency, performing a subsequent training iteration of the one or more training iterations, and otherwise causing application at the memory devices, during memory operations, of a highest clock signal frequency corresponding to a training iteration for which performance of the clock signal was within target performance ranges of the memory devices.

Example 29 includes the subject matter of Example 28, wherein the memory module includes a dual inline memory module (DIMM), and the memory devices include respective dynamic random access memories (DRAMs).

Example 30 includes the subject matter of Example 29, wherein the DIMM includes a register coupled to the DRAMs, the operations including causing the modified clock signal frequency to be applied by sending a command through the register to modify clock signal frequency at the DRAMs.

Example 31 includes the subject matter of Example 28, wherein each of the one or more training iterations further includes modifying a termination level of at least one of the memory devices based on the clock signal frequency and prior to decoding.

Example 32 includes the subject matter of Example 27, wherein the one or more training iterations include a plurality of training iterations, the operations including: modifying the clock signal frequency at each successive training iteration to a successively higher clock signal frequency until a determination that the performance of the clock signal does not fall within the target performance range; and in response to the determination that the performance of the clock signal does not fall within the target performance range, causing the application at the memory device, during the memory operation, of the highest clock signal frequency corresponding to the training iteration for which performance of the clock signal was within the target performance range.

Example 33 includes the subject matter of Example 27, wherein the quality feedback message includes encoded data corresponding to a maximum voltage detected at the memory device based on the clock signal frequency.

Example 34 includes the subject matter of Example 33, wherein the encoded data consists of n-bit binary data, the operations including receiving the n-bit binary data through n respective data (DQ) buses connected to an I/O interface.

Example 35 includes the subject matter of Example 33, wherein the target performance range of the memory device corresponds to a minimum acceptable voltage level at the memory device based on the clock signal frequency.

Example 36 includes the subject matter of Example 27, further including determining the target performance range from serial presence detect (SPD) data corresponding to the memory device.

Example 37 includes the subject matter of Example 27, wherein the operations include at least one of: determining whether the performance of the clock signal frequency falls within the target performance range of the memory device or receiving, through the I/O interface, information based on a determination as to whether the performance of the clock signal frequency falls within the target performance range of the memory device.

Example 38 includes the subject matter of Example 27, wherein integrated circuit includes a memory controller of a host processor.

Example 39 includes the subject matter of Example 27, wherein performing the one or more training iterations to tune the target clock signal frequency includes performing the one or more training iterations to tune the target clock signal frequency during initialization of the memory device.

Example 40 includes an apparatus including means to perform a method of any one of Examples 14-26.

Example 41 includes an integrated circuit of a memory system including a memory device, the integrated circuit including: an input and output (I/O) interface to connect to a memory controller; one or more processors coupled to the I/O interface and configured to: decode a command from the memory controller to apply a modified clock signal frequency at the memory device; apply the clock signal frequency at the memory device; analyze a performance of the clock signal frequency at the memory device; and encode, and send to the memory controller, a quality feedback message including an indication of the performance of the clock signal frequency.

Example 42 includes the subject matter of Example 41, including a memory module comprising a plurality of memory devices that include the memory device; the one or more processors are to: decode the command from the memory controller to apply a modified clock signal frequency at the plurality of memory devices; apply the clock signal frequency at the memory devices; analyze a performance of the clock signal frequency at each of the memory devices; and encode and send to the memory controller respective quality feedback messages including respective indications of the performance of the clock signal frequency at each of the memory devices.

Example 43 includes the subject matter of Example 41, wherein the indication of the performance of the clock signal frequency includes an indication of a determination that the performance of the clock signal frequency falls within a target performance range of the memory device.

Example 44 includes the subject matter of Example 43, wherein the one or more processors are to determine whether the performance of the clock signal frequency falls within the target performance range of the memory device.

Example 45 includes the subject matter of Example 41, where the one or more processors are to implement a self-refresh at the memory device after decoding the command.

Example 46 includes the subject matter of Example 41, further including a dual inline memory module (DIMM), wherein the memory devices include respective dynamic random access memories (DRAMs) disposed on the DIMM.

Example 47 includes the subject matter of Example 46, wherein the DIMM includes a register coupled to the DRAMs, the one or more processors to receive the command from the memory controller from the register prior to decoding the command.

Example 48 includes the subject matter of Example 43, wherein the quality feedback message includes encoded data corresponding to a maximum voltage detected at the memory device based on the clock signal frequency.

Example 49 includes the subject matter of Example 48, wherein the encoded data consists of n-bit binary data, the one or more processors to send the n-bit binary data to the memory controller through n respective data (DQ) buses connected to the I/O interface.

Example 50 includes the subject matter of Example 48, wherein the target performance range of the memory device corresponds to a minimum acceptable voltage level at the memory device based on the clock signal frequency.

Example 51 includes the subject matter of Example 43, further including an Electrically Erasable Programmable Read-Only Memory (EEPROM), wherein the target performance range is encoded as serial presence detect (SPD) data on the EEPROM.

Example 52 includes the subject matter of Example 41, wherein the one or more processors are to encode and send the quality feedback message during initialization of the memory device.

Example 53 includes method to be performed at an integrated circuit of a memory system including a memory device, the method including: decoding a command from a memory controller to apply a modified clock signal frequency at the memory device; applying the clock signal frequency at the memory device; analyzing a performance of the clock signal frequency at the memory device; and encoding, and sending to the memory controller, a quality feedback message including an indication of the performance of the clock signal frequency.

Example 54 includes the subject matter of Example 53, wherein the integrated circuit includes a memory module comprising a plurality of memory devices that include the memory device, the method further including: decoding the command from the memory controller to apply a modified clock signal frequency at the plurality of memory devices; applying the clock signal frequency at the memory devices; analyzing a performance of the clock signal frequency at each of the memory devices; and encoding and sending to the memory controller respective quality feedback messages including respective indications of the performance of the clock signal frequency at each of the memory devices.

Example 55 includes the subject matter of Example 53, wherein the indication of the performance of the clock signal frequency includes an indication of a determination that the performance of the clock signal frequency falls within a target performance range of the memory device.

Example 56 includes the subject matter of Example 55, further including determining whether the performance of the clock signal frequency falls within the target performance range of the memory device.

Example 57 includes the subject matter of Example 53, further including implementing a self-refresh at the memory device after decoding the command.

Example 58 includes the subject matter of Example 53, wherein the integrated circuit includes a dual inline memory module (DIMM), wherein the memory devices include respective dynamic random access memories (DRAMs) disposed on the DIMM.

Example 59 includes the subject matter of Example 58, wherein the DIMM includes a register coupled to the DRAMs, the method including receiving the command from the memory controller from the register prior to decoding the command.

Example 60 includes the subject matter of Example 55, wherein the quality feedback message includes encoded data corresponding to a maximum voltage detected at the memory device based on the clock signal frequency.

Example 61 includes the subject matter of Example 60, wherein the encoded data consists of n-bit binary data, the method including sending the n-bit binary data to the memory controller through n respective data (DQ) buses connected to the I/O interface.

Example 62 includes the subject matter of Example 60, wherein the target performance range of the memory device corresponds to a minimum acceptable voltage level at the memory device based on the clock signal frequency.

Example 63 includes the subject matter of Example 53, further including encoding and sending the quality feedback message during initialization of the memory device.

Example 64 includes a non-transitory machine-readable storage medium having instructions stored thereon, the instructions, when executed by an integrated circuit of a memory system, to cause the integrated circuit to perform operations including: decoding a command from a memory controller to apply a modified clock signal frequency at a memory device; applying the clock signal frequency at the memory device; analyzing a performance of the clock signal frequency at the memory device; and encoding, and sending to the memory controller, a quality feedback message including an indication of the performance of the clock signal frequency.

Example 65 includes the subject matter of Example 64, wherein the integrated circuit includes a memory module comprising a plurality of memory devices that include the memory device, the operations further including: decoding the command from the memory controller to apply a modified clock signal frequency at the plurality of memory devices; applying the clock signal frequency at the memory devices; analyzing a performance of the clock signal frequency at each of the memory devices; and encoding and sending to the memory controller respective quality feedback messages including respective indications of the performance of the clock signal frequency at each of the memory devices.

Example 66 includes the subject matter of Example 64, wherein the indication of the performance of the clock signal frequency includes an indication of a determination that the performance of the clock signal frequency falls within a target performance range of the memory device.

Example 67 includes the subject matter of Example 66, further including determining whether the performance of the clock signal frequency falls within the target performance range of the memory device.

Example 68 includes the subject matter of Example 64, further including implementing a self-refresh at the memory device after decoding the command.

Example 69 includes the subject matter of Example 64, wherein the integrated circuit includes a dual inline memory module (DIMM), wherein the memory devices include respective dynamic random access memories (DRAMs) disposed on the DIMM.

Example 70 includes the subject matter of Example 69, wherein the DIMM includes a register coupled to the DRAMs, the operations including receiving the command from the memory controller from the register prior to decoding the command.

Example 71 includes the subject matter of Example 67, wherein the quality feedback message includes encoded data corresponding to a maximum voltage detected at the memory device based on the clock signal frequency.

Example 72 includes the subject matter of Example 71, wherein the encoded data consists of n-bit binary data, the operations including sending the n-bit binary data to the memory controller through n respective data (DQ) buses connected to the I/O interface.

Example 73 includes the subject matter of Example 71, wherein the target performance range of the memory device corresponds to a minimum acceptable voltage level at the memory device based on the clock signal frequency.

Example 74 includes the subject matter of Example 64, the operations further including encoding and sending the quality feedback message during initialization of the memory device.

Example 75 includes an apparatus including means to perform a method of any one of Examples 53-63.

What is claims is:

1. An integrated circuit of a memory subsystem including:
   an input and output (I/O) interface to connect to a memory device;
   one or more processors coupled to the I/O interface and configured to:
      perform one or more training iterations to tune a target clock signal frequency to be applied at the memory device, each of the one or more training iterations including:
         causing a modified clock signal frequency to be applied at the memory device; and
         decoding a quality feedback message from the memory device including an indication of a performance of the clock signal frequency at the memory device; and
      in response to a determination that the performance of the clock signal frequency falls within a target performance range of the memory device and that the clock signal frequency is below the target clock signal frequency, perform a subsequent training iteration of the one or more training iterations, and otherwise cause application at the memory device, during a memory operation, of a highest clock signal frequency corresponding to a training iteration for which performance of the clock signal was within the target performance range.

2. The integrated circuit of claim 1, wherein:
   the memory device is part of a memory module including a plurality of memory devices;
   the one or more processors are to perform the one or more training iterations to tune the target clock signal frequency to be applied at the memory devices;
   causing includes causing the modified clock signal frequency to be applied at the memory devices; and
   decoding a quality feedback message from the memory device includes decoding a respective quality feedback message from respective ones of the memory devices, each quality feedback message including an indication of a performance of the clock signal frequency at respective ones of the memory devices; and
   the one or more processors are further to, in response to a determination that the performance of the clock signal at said respective ones of the memory devices falls within a corresponding target performance range the respective ones of the memory devices, and that the clock signal frequency is below the target clock signal frequency, perform a subsequent training iteration of the one or more training iterations, and otherwise cause application at the memory devices, during memory operations, of a highest clock signal frequency corresponding to a training iteration for which performance of the clock signal was within target performance ranges of the memory devices.

3. The integrated circuit of claim 2, wherein the memory module includes a dual inline memory module (DIMM), and the memory devices include respective dynamic random access memories (DRAMs).

4. The integrated circuit of claim 3, wherein the DIMM includes a register coupled to the DRAMs, the one or more processors to cause the modified clock signal frequency to be applied by sending a command through the register to modify clock signal frequency at the DRAMs.

5. The integrated circuit of claim 2, wherein each of the one or more training iterations further includes modifying a termination level of at least one of the memory devices based on the clock signal frequency and prior to decoding.

6. The integrated circuit of claim 1, wherein the one or more training iterations include a plurality of training iterations, the one or more processors to:
modify the clock signal frequency at each successive training iteration to a successively higher clock signal frequency until a determination that the performance of the clock signal does not fall within the target performance range; and
in response to the determination that the performance of the clock signal does not fall within the target performance range, cause the application at the memory device, during the memory operation, of the highest clock signal frequency corresponding to the training iteration for which performance of the clock signal was within the target performance range.

7. The integrated circuit of claim 1, wherein the quality feedback message includes encoded data corresponding to a maximum voltage detected at the memory device based on the clock signal frequency.

8. The integrated circuit of claim 7, wherein the encoded data consists of n-bit binary data, the one or more processors to receive the n-bit binary data through n respective data (DQ) buses connected to the I/O interface.

9. The integrated circuit of claim 7, wherein the target performance range of the memory device corresponds to a minimum acceptable voltage level at the memory device based on the clock signal frequency.

10. The integrated circuit of claim 1, wherein the one or more processors are to determine the target performance range from serial presence detect (SPD) data corresponding to the memory device.

11. The integrated circuit of claim 1, wherein the one or more processors are at least one of: to determine whether the performance of the clock signal frequency falls within the target performance range of the memory device or to receive, through the I/O interface, information based on a determination as to whether the performance of the clock signal frequency falls within the target performance range of the memory device.

12. The integrated circuit of claim 1, wherein the I/O interface and the one or more processors are part of a memory controller, the integrated circuit further including a central processing unit connected to the memory controller through the I/O interface.

13. The integrated circuit of claim 1, wherein the one or more processors are to tune the target clock signal frequency during initialization of the memory device.

14. A method to be performed at an integrated circuit of a memory subsystem, the method including:
performing one or more training iterations to tune a target clock signal frequency to be applied at a memory device, each of the one or more training iterations including:
causing a modified clock signal frequency to be applied at the memory device; and
decoding a quality feedback message from the memory device including an indication of a performance of the clock signal frequency at the memory device; and
in response to a determination that the performance of the clock signal frequency falls within a target performance range of the memory device and that the clock signal frequency is below the target clock signal frequency, performing a subsequent training iteration of the one or more training iterations, and otherwise causing application at the memory device, during a memory operation, of a highest clock signal frequency corresponding to a training iteration for which performance of the clock signal was within the target performance range.

15. The method of claim 14, wherein:
the memory device is part of a memory module including a plurality of memory devices;
performing includes performing the one or more training iterations to tune the target clock signal frequency to be applied at the memory devices;
causing includes causing the modified clock signal frequency to be applied at the memory devices; and
decoding a quality feedback message from the memory device includes decoding a respective quality feedback message from respective ones of the memory devices, each quality feedback message including an indication of a performance of the clock signal frequency at respective ones of the memory devices; and
the method further includes, in response to a determination that the performance of the clock signal at said respective ones of the memory devices falls within a corresponding target performance range the respective ones of the memory devices, and that the clock signal frequency is below the target clock signal frequency, performing a subsequent training iteration of the one or more training iterations, and otherwise causing application at the memory devices, during memory operations, of a highest clock signal frequency corresponding to a training iteration for which performance of the clock signal was within target performance ranges of the memory devices.

16. The method of claim 15, wherein the memory module includes a dual inline memory module (DIMM), and the memory devices include respective dynamic random access memories (DRAMs).

17. The method of claim 15, wherein each of the one or more training iterations further includes modifying a termination level of at least one of the memory devices based on the clock signal frequency and prior to decoding.

18. The method of claim 14, wherein the one or more training iterations include a plurality of training iterations, the method including:
modifying the clock signal frequency at each successive training iteration to a successively higher clock signal frequency until a determination that the performance of the clock signal does not fall within the target performance range; and in response to the determination that the performance of the clock signal does not fall within the target performance range, causing the application at the memory device, during the memory operation, of the highest clock signal frequency corresponding to the training iteration for which performance of the clock signal was within the target performance range.

19. The method of claim 14, wherein the quality feedback message includes encoded data corresponding to a maximum voltage detected at the memory device based on the clock signal frequency.

20. The method of claim 19, wherein the encoded data consists of n-bit binary data, the method including receiving the n-bit binary data through n respective data (DQ) buses connected to an I/O interface.

21. A non-transitory machine-readable storage medium having instructions stored thereon, the instructions, when executed by an integrated circuit of a memory subsystem, to cause the integrated circuit to perform operations including:

performing one or more training iterations to tune a target clock signal frequency to be applied at a memory device, each of the one or more training iterations including:

causing a modified clock signal frequency to be applied at the memory device; and decoding a quality feedback message from the memory device including an indication of a performance of the clock signal frequency at the memory device; and in response to a determination that the performance of the clock signal frequency falls within a target performance range of the memory device and that the clock signal frequency is below the target clock signal frequency, performing a subsequent training iteration of the one or more training iterations, and otherwise causing application at the memory device, during a memory operation, of a highest clock signal frequency corresponding to a training iteration for which performance of the clock signal was within the target performance range.

22. The machine-readable storage medium of claim 21, wherein:

the memory device is part of a memory module including a plurality of memory devices;

performing includes performing the one or more training iterations to tune the target clock signal frequency to be applied at the memory devices;

causing includes causing the modified clock signal frequency to be applied at the memory devices; and decoding a quality feedback message from the memory device includes decoding a respective quality feedback message from respective ones of the memory devices, each quality feedback message including an indication of a performance of the clock signal frequency at respective ones of the memory devices; and the operations further include, in response to a determination that the performance of the clock signal at said respective ones of the memory devices falls within a corresponding target performance range the respective ones of the memory devices, and that the clock signal frequency is below the target clock signal frequency, performing a subsequent training iteration of the one or more training iterations, and otherwise causing application at the memory devices, during memory operations, of a highest clock signal frequency corresponding to a training iteration for which performance of the clock signal was within target performance ranges of the memory devices.

23. The machine-readable storage medium of claim 22, wherein the memory module includes a dual inline memory module (DIMM), and the memory devices include respective dynamic random access memories (DRAMs).

24. The machine-readable storage medium of claim 23, wherein the DIMM includes a register coupled to the DRAMs, the operations including causing the modified clock signal frequency to be applied by sending a command through the register to modify clock signal frequency at the DRAMs.

25. The machine-readable storage medium of claim 21, wherein the one or more training iterations include a plurality of training iterations, the operations including:

modifying the clock signal frequency at each successive training iteration to a successively higher clock signal frequency until a determination that the performance of the clock signal does not fall within the target performance range; and in response to the determination that the performance of the clock signal does not fall within the target performance range, causing the application at the memory device, during the memory operation, of the highest clock signal frequency corresponding to the training iteration for which performance of the clock signal was within the target performance range.

* * * * *